(12) United States Patent
Fujdala et al.

(10) Patent No.: US 8,828,787 B2
(45) Date of Patent: Sep. 9, 2014

(54) INKS WITH ALKALI METALS FOR THIN FILM SOLAR CELL PROCESSES

(75) Inventors: Kyle L. Fujdala, San Jose, CA (US); Zhongliang Zhu, San Jose, CA (US); David Padowitz, Mountain View, CA (US); Paul R. Markoff Johnson, Sunnyvale, CA (US); Wayne A. Chomitz, Santa Monica, CA (US); Matthew C. Kuchta, San Franicsco, CA (US)

(73) Assignee: Precursor Energetics, Inc., Santa Clara, CA (US)

( * ) Notice: Subject to any disclaimer, the term of this patent is extended or adjusted under 35 U.S.C. 154(b) by 17 days.

(21) Appl. No.: 13/234,033

(22) Filed: Sep. 15, 2011

(65) Prior Publication Data

US 2012/0073633 A1    Mar. 29, 2012

Related U.S. Application Data

(60) Provisional application No. 61/383,292, filed on Sep. 15, 2010, provisional application No. 61/439,735, filed on Feb. 4, 2011, provisional application No. 61/498,383, filed on Jun. 17, 2011.

(51) Int. Cl.
     *H01L 21/00* (2006.01)
(52) U.S. Cl.
     USPC ............... 438/96; 438/17; 438/95; 438/98; 257/E27.125; 257/E25.007; 257/E23.166
(58) Field of Classification Search
     USPC ............. 438/17, 95, 96, 98; 257/E27.125, 257/E25.007, E23.166
     See application file for complete search history.

(56) References Cited

U.S. PATENT DOCUMENTS

| 2,514,981 | A |   | 7/1950  | Walker      |         |
|-----------|---|---|---------|-------------|---------|
| 4,335,266 | A |   | 6/1982  | Mickelsen   |         |
| 5,436,204 | A |   | 7/1995  | Albin       |         |
| 5,441,897 | A |   | 8/1995  | Noufi       |         |
| 5,626,688 | A | * | 5/1997  | Probst et al. | 136/265 |
| 5,681,975 | A |   | 10/1997 | Brennan     |         |
| 5,871,630 | A |   | 2/1999  | Bhattacharya |        |
| 5,882,722 | A |   | 3/1999  | Kydd        |         |
| 5,976,614 | A |   | 11/1999 | Bhattacharya |        |
| 5,981,868 | A |   | 11/1999 | Kushiya     |         |

(Continued)

FOREIGN PATENT DOCUMENTS

| EP | 0534459 A2 | 3/1993 |
|----|------------|--------|
| JP | 5790867    | 6/1982 |

(Continued)

OTHER PUBLICATIONS

Beachley, Organometallics 1996, 15, 3653-3658.

(Continued)

*Primary Examiner* — Michelle Mandala
(74) *Attorney, Agent, or Firm* — Eckman Basu LLP

(57) ABSTRACT

Processes for making a thin film solar cell on a substrate by providing a substrate coated with an electrical contact layer, depositing an ink onto the contact layer of the substrate, wherein the ink contains an alkali ion source compound suspended or dissolved in a carrier along with photovoltaic absorber precursor compounds, and heating the substrate. The alkali ion source compound can be $M^{alk}M^B(ER)_4$ or $M^{alk}(ER)$. The processes can be used for CIS or CIGS.

21 Claims, 8 Drawing Sheets

(56) References Cited

U.S. PATENT DOCUMENTS

| | | | |
|---|---|---|---|
| 5,985,691 A | 11/1999 | Basol | |
| 6,066,196 A | 5/2000 | Kaloyeros | |
| 6,126,740 A | 10/2000 | Schulz | |
| 6,325,490 B1 | 12/2001 | Yang | |
| 6,368,892 B1 | 4/2002 | Arya | |
| 6,372,538 B1 | 4/2002 | Wendt | |
| 6,500,733 B1 | 12/2002 | Stanbery | |
| 6,518,086 B2 | 2/2003 | Beck | |
| 6,635,307 B2 | 10/2003 | Huang | |
| 6,797,874 B2 | 9/2004 | Stanbery | |
| 6,830,778 B1 | 12/2004 | Schulz | |
| 6,852,920 B2 | 2/2005 | Sager | |
| 6,875,661 B2 | 4/2005 | Mitzi | |
| 6,878,470 B2 * | 4/2005 | Kawamura et al. | 428/690 |
| 6,967,115 B1 | 11/2005 | Sheats | |
| 6,974,976 B2 | 12/2005 | Hollars | |
| 6,987,071 B1 | 1/2006 | Bollman | |
| 6,992,202 B1 | 1/2006 | Banger | |
| 7,026,258 B2 | 4/2006 | Taunier | |
| 7,094,651 B2 | 8/2006 | Mitzi | |
| 7,109,520 B2 | 9/2006 | Yu | |
| 7,179,677 B2 | 2/2007 | Ramanathan | |
| 7,194,197 B1 | 3/2007 | Wendt | |
| 7,235,736 B1 | 6/2007 | Buller | |
| 7,247,346 B1 | 7/2007 | Sager | |
| 7,259,322 B2 | 8/2007 | Gronet | |
| 7,306,823 B2 | 12/2007 | Sager | |
| 7,341,917 B2 | 3/2008 | Milliron | |
| 7,384,680 B2 | 6/2008 | Bi | |
| 7,494,841 B2 | 2/2009 | Mitzi | |
| 7,517,718 B2 | 4/2009 | Mitzi | |
| 7,563,392 B1 | 7/2009 | Hsu | |
| 7,618,841 B2 | 11/2009 | Mitzi | |
| 7,663,057 B2 | 2/2010 | Yu | |
| 8,067,262 B2 * | 11/2011 | Fujdala et al. | 438/95 |
| 8,067,628 B2 * | 11/2011 | Fujdala et al. | 556/26 |
| 8,158,033 B2 * | 4/2012 | Fujdala et al. | 252/519.34 |
| 8,168,090 B2 * | 5/2012 | Fujdala et al. | 252/519.14 |
| 8,198,123 B2 | 6/2012 | Britt | |
| 2003/0123167 A1 | 7/2003 | Kolberg | |
| 2004/0063320 A1 | 4/2004 | Hollars | |
| 2004/0250848 A1 | 12/2004 | Sager | |
| 2005/0121068 A1 | 6/2005 | Sager | |
| 2005/0183767 A1 | 8/2005 | Yu | |
| 2006/0057766 A1 | 3/2006 | Jia | |
| 2006/0060237 A1 | 3/2006 | Leidholm | |
| 2006/0062902 A1 | 3/2006 | Sanger | |
| 2006/0157103 A1 | 7/2006 | Sheats | |
| 2007/0000537 A1 | 1/2007 | Leidholm | |
| 2007/0163383 A1 | 7/2007 | Van Duren | |
| 2007/0163637 A1 | 7/2007 | Robinson | |
| 2007/0163638 A1 | 7/2007 | Van Duren | |
| 2007/0163639 A1 | 7/2007 | Robinson | |
| 2007/0163640 A1 | 7/2007 | Van Duren | |
| 2007/0163641 A1 | 7/2007 | Van Duren | |
| 2007/0163642 A1 | 7/2007 | Van Duren | |
| 2007/0163643 A1 | 7/2007 | Van Duren | |
| 2007/0163644 A1 | 7/2007 | Van Duren | |
| 2007/0169812 A1 | 7/2007 | Robinson | |
| 2007/0169813 A1 | 7/2007 | Robinson | |
| 2007/0178620 A1 | 8/2007 | Basol | |
| 2007/0207565 A1 | 9/2007 | Kodas | |
| 2007/0264488 A1 | 11/2007 | Lee | |
| 2008/0057203 A1 | 3/2008 | Robinson | |
| 2008/0057616 A1 | 3/2008 | Robinson | |
| 2008/0124833 A1 | 5/2008 | Ruiz | |
| 2008/0135099 A1 | 6/2008 | Yu | |
| 2008/0135811 A1 | 6/2008 | Yu | |
| 2008/0135812 A1 | 6/2008 | Yu | |
| 2008/0138501 A1 | 6/2008 | Yu | |
| 2008/0142072 A1 | 6/2008 | Yu | |
| 2008/0142080 A1 | 6/2008 | Yu | |
| 2008/0142081 A1 | 6/2008 | Yu | |
| 2008/0142082 A1 | 6/2008 | Yu | |
| 2008/0142083 A1 | 6/2008 | Yu | |
| 2008/0142084 A1 | 6/2008 | Yu | |
| 2008/0145633 A1 | 6/2008 | Kodas | |
| 2008/0149176 A1 | 6/2008 | Sager | |
| 2008/0175982 A1 | 7/2008 | Robinson | |
| 2008/0213467 A1 | 9/2008 | Yu | |
| 2008/0257201 A1 | 10/2008 | Harris | |
| 2009/0084427 A1 | 4/2009 | Anderson | |
| 2009/0107550 A1 | 4/2009 | Van Duren | |
| 2009/0169723 A1 | 7/2009 | Hanket | |
| 2009/0253227 A1 | 10/2009 | Defries | |
| 2009/0260670 A1 | 10/2009 | Li | |
| 2009/0280598 A1 | 11/2009 | Curtis | |
| 2009/0280624 A1 | 11/2009 | Curtis | |
| 2010/0029036 A1 | 2/2010 | Robinson | |
| 2010/0291758 A1 | 11/2010 | Robinson | |
| 2011/0030785 A1 * | 2/2011 | Fujdala et al. | 136/258 |
| 2011/0030799 A1 * | 2/2011 | Fujdala et al. | 136/262 |
| 2011/0031453 A1 * | 2/2011 | Fujdala et al. | 252/519.14 |
| 2011/0146532 A1 * | 6/2011 | Fujdala et al. | 106/31.13 |
| 2012/0067407 A1 * | 3/2012 | Fujdala et al. | 136/252 |

FOREIGN PATENT DOCUMENTS

| | | |
|---|---|---|
| JP | 10-273783 A | 10/1998 |
| JP | 2000-058893 A | 2/2000 |
| JP | 200283824 | 3/2002 |
| JP | 2008056511 | 8/2006 |
| JP | 2008-56511 A | 3/2008 |
| KR | 10-2009-0029495 A | 3/2009 |
| KR | 10-2009-0050558 A | 5/2009 |
| WO | WO9304212 A1 | 3/1993 |
| WO | WO2007082080 A1 | 7/2007 |
| WO | WO2008057119 A1 | 5/2008 |
| WO | WO2008063190 A2 | 5/2008 |
| WO | WO2008104087 A1 | 9/2008 |
| WO | WO2009061134 A1 | 5/2009 |
| WO | WO2009064056 A1 | 5/2009 |

OTHER PUBLICATIONS

Borisova, Organometallics 2002, 21, 4005-4008.
Deivaraj, Inorg. Chem. 2002, 41, 3755-3760.
Deivaraj, Chem. Mater. 2003, 15, 2383-2391.
Kuckmann, Inorg. Chem. 2005, 44, 3449-3458.
Lazell, Chem. Mater. 1999, 11, 3430-3432.
Malik, Chem. Mater. 2001, 13, 913-920.
McAleese, Chem. Vap. Deposition 1998, 4, No. 3, 94-96.
Nguyen, Chem. Commun., 2006, 2182-2184.
Nomura, Polyhedron 1989, vol. 8, No. 15, 1891-1896.
Nomura, J. Mater. Chem., 1992,2(7), 765-766.
Stoll, Chem. Mater. 1998, 10, 650-657.
Tian, Inorg. Chem. 2006, 45, 8258-8263.
Tran, Organometallics 2000, 19, 5202-5208.
Wallbank, Organometallics 2005, 24, 788-790.
Eichofer, J. Chem. Soc., Dalton Trans., 2000, 941-944.
Chen, Physical Review B 79, 165211, 1-10 (2009).
Banger, Applied Organometallic Chemistry, 2002, vol. 16, pp. 617-627.
Banger, Inorg Chem, 2003, vol. 42(24), pp. 7713-7715.
Chen, Chem Mater 2007, vol. 19, pp. 5256-5261.
Dennier, Adv Mater 2009, vol. 21, pp. 1323-1338.
Kaelin, Solar Energy, 2004, vol. 77, pp. 749-756.
Kundu, Thin Solid Films, 2006, vol. 515, pp. 2625-2631.
Yoon, Bull Korean Chem Soc, 2006, vol. 27(12), pp. 2071-2073.
Kumar, J. Chem. Soc. Dalton Trans. 1988, p. 1045-1047, Reactions of Some Main Group Metals with Diphenyl Disulphide and Diphenyl Diselenide.
Green, Inorg. Chem. 1989, V28, 123-127.
Nomura, Polyhedron vol. 9, No. 213, pp. 361-366, 1990.
Nomura, Applied Organometallic Chemistry, vol. 6, 685-691 (1992).
Hirpo, J. Am. Chem. Soc. 1993, V115, 1597-1599.
Ohlmann, J. Chem. Soc., Chem. Commun., 1995, p. 1011-1012.
Beck, Thin Solid Films 272 ( 1996) 71-82.
Grigsby, J. Chem. Soc., Dalton Trans., 1998, pp. 2547-2556.
Suh, Inorg. Chem. 1999, 38, 1627-1633.
Banger, Chem. Mater. 2001, 13, 3827-3829.

(56) References Cited

OTHER PUBLICATIONS

Deivaraj, Chem. Commun., 2001, 2304-2305.
Kapur, Thin Solid Films 431-432 (2003) 53-57.
Ahlrichs, Eur. J. Inorg. Chem. 2006, 345-350.
Milliron, Chem. Mater., vol. 18, No. 3, 2006, p. 587-590.
Vittal, Acc. Chem. Res. 2006, 39, 869-877.
Yamada, Science and Technology of Advanced Materials 7 (2006) 42-45.
Borecki, Inorg. Chem. 2007, 46, 2478-2484.
Schneider, Chem. Mater. 2007, 19, 2780-2785.
Merdes, Thin Solid Films 516 (2008) 7335-7339.
Panthani, J. Am. Chem. Soc. 2008, 130, 16770-16777.
Hepp, Solution Processing of Inorganic Materials, edited by David Mitzi, 2009, Chapter 6, p. 157-198.
Hou, Thin Solid Films (2009) pp. 1-4, Low-temperature processing of a solution-deposited CuInSSe thin-film solar cell.
Malik, J. Mater. Res., vol. 24, No. 4, Apr. 2009, p. 1375-1387.
Mitzi, Thin Solid Films 517 (2009) 2158-2162.
Park, Journal ofCrystalGrowth 311 (2009) 2621-2625.
Dwyer, Solar Energy Materials & Solar Cells 94 (2010) 598-605.
Hibberd, Prog. Photovolt: Res. Appl. 2010; 18:434-452.
Niki, Prog. Photovolt: Res. Appl. 2010; 18:453-466.
Yuan, Chem. Mater. 2010,22,285-287.
Zhong, Chem. Mater. 2008, vol. 20, pp. 6434-6443.
Basol, 1994 IEEE, First WCPEC, Dec. 5-9, Hawaii, pp. 148-151.
Contreras, 1997, 26th PVSC, Sep. 30-Oct. 3, Anaheim.
Dawson-Elli, 1994 IEEE, First WCPEC, Dec. 5-9, Hawaii, pp. 152-155.
Hedstrom, 1993 IEEE, pp. 364-371.
Jasenek, Thin Solid Films 361-362 (2000) 415-419.
Kimura, Solar Energy Materials & Solar Cells 67 (2001) 289-295.
Kwon, Journal of the Korean Physical Society, vol. 39, No. 4, Oct. 2001, pp. 655-660.
Palm, Thin Solid Films 431-432 (2003) 514-522.
Rau, Solar Energy Materials & Solar Cells 67 (2001) 137-143.
Rimmasch, 1994 IEEE, First WCPEC, Dec. 5-9, Hawaii, pp. 144-147.
Rockett, Thin Solid Films 372 (2000) 212-217.
Schock, Appl. Phys. A 69, 131-147 (1999).
Scofield, Proc. of the 24th IEEE Photovoltaic Specialists Conference (IEEE, New York, 1995), pp. 164-167.
Sites, Device Physics of Thin-Film Polycrystalline Cells and Modules, Phase I Annual Report, Dec. 1999, NREL/SR-520-27663, pp. 1-22.
Sites, Device Physics of Thin-Film Polycrystalline Cells and Modules, Final Report, Jan. 2002, NREL/SR-520-31458, pp. 1-47.
Tarrant, Thin-Film Photovoltaic Partnership Program, CIS Module Process R&D, Final Technical Report, Oct. 2005-Jun. 2006, National Renewable Energy Laboratory, pp. 1-64.
Palm, Thin Solid Films 431-432 (2003) 514-522, CIS module pilot processing applying concurrent rapid selenization and sulfurization of large area thin film precursors.
Tarrant, National Renewable Energy Laboratory, Final Technical Report Oct. 2005-Jun. 2006, Thin-Film Photovoltaic Partnership Program CIS Module Process R&D, p. 1-64.
Sites, National Renewable Energy Laboratory, Jan. 2002, NREL/SR-520-31458, Final Report Feb. 1998-Aug. 2001, Device Physics of Thin-Film Polycrystalline Cells and Modules, p. 1-47.
Rau, Solar Energy Materials & Solar Cells 67 (2001) 137}143, Electrical characterization of Cu(In,Ga)Se2 thin-film solar cells and the role of defects for the device performance.
Sites, National Renewable Energy Laboratory, Dec. 1999, NREL/SR-520-27663, Phase I Annual Report, Feb. 1998-Jan. 1999, Device Physics of Thin-Film Polycrystalline Cells and Modules, p. 1-22.
Kwon, Journal of the Korean Physical Society, vol. 39, No. 4, Oct. 2001, pp. 655-660, Characterization of Cu (In1-xGax)Se2 Films Prepared by Three-Stage Coevaporation and Their Application to CIGS Solar Cells for a 14.48 % Efficiency.
Hedstrom, 0-7803-1220-1/93,1993 IEEE, ZnO/CdS/Cu(In,Ga)Se, Thin Film Solar Cells With Improved Performance, p. 364-371.
Dawson-Elli, CH3365-449440000-0152,1994 IEEE, First WCPEC; Dec. 5-9, 1994; Hawaii, Substrate Influences on CIS Device Performance, p. 152-155.
Contreras, 26th PVSC; Sep. 30Oct. 3, 1997; Anaheim, CA, on the Role of Na and Modifications to Cu (In,Ga)Se, Absorber Materials Using Thin-MF: (M=Na, K, Cs) Precursor Layers, p. 359-362.
Basol, CH3365-4/94/0000-0148,1994 IEEE, First WCPEC; Dec. 5-9, 1994; Hawaii, Studies on Substrates and Contacts for CIS Films and Devices, p. 148-151.
Erslev, Mat Res Soc Symp Proc, 2009, vol. 1165, 1165-M01-07, pp. 1-6.
Afzaal, Single-Source Approach for the Growth of I-III-VI Thin Films, 2002 Mat. Res. Soc. Symp. Proc. vol. 730, pp. V522.1-V5.22.6.

* cited by examiner ized as solar cells is important for providing a renewable source of energy and many other uses. The demand for power is ever-rising as the human population increases. In many geographic areas,

INKS WITH ALKALI METALS FOR THIN FILM SOLAR CELL PROCESSES

CROSS REFERENCE TO RELATED APPLICATIONS

This application claims the benefit of U.S. Provisional Application No. 61/498,383, filed Jun. 17, 2011, U.S. Provisional Application No. 61/439,735, filed Feb. 4, 2011, and U.S. Provisional Application No. 61/383,292, filed Sep. 15, 2010, each of which is hereby incorporated by reference in its entirety.

BACKGROUND

The development of photovoltaic devices such as solar cells is important for providing a renewable source of energy and many other uses. The demand for power is ever-rising as the human population increases. In many geographic areas, solar cells may be the only way to meet the demand for power. The total energy from solar light impinging on the earth for one hour is about $4 \times 10^{20}$ joules. It has been estimated that one hour of total solar energy is as much energy as is used worldwide for an entire year. Thus, billions of square meters of efficient solar cell devices will be needed.

Photovoltaic devices are made by a variety of processes in which layers of semiconducting material are created on a substrate. Layers of additional materials are used to protect the photovoltaic semiconductor layers and to conduct electrical energy out of the device. Thus, the usefulness of an optoelectronic or solar cell product is in general limited by the nature and quality of the photovoltaic layers.

One way to produce a solar cell product involves depositing a thin, light-absorbing, solid layer of the material copper indium gallium diselenide, known as "CIGS," on a substrate. A solar cell having a thin film CIGS layer can provide low to moderate efficiency for conversion of sunlight to electricity.

Making a CIGS semiconductor generally requires using several source compounds and/or elements which contain the atoms needed for CIGS. The source compounds and/or elements must be formed or deposited in a thin, uniform layer on a substrate. For example, deposition of the CIGS sources can be done as a co-deposition, or as a multistep deposition. The difficulties with these approaches include lack of uniformity, purity and homogeneity of the CIGS layers, leading ultimately to limited light conversion efficiency.

For example, some methods for solar cells are disclosed in U.S. Pat. Nos. 5,441,897, 5,976,614, 6,518,086, 5,436,204, 5,981,868, 7,179,677, 7,259,322, U.S. Patent Publication No. 2009/0280598, and PCT International Application Publication Nos. WO2008057119 and WO2008063190.

Other disadvantages in the production of thin film devices are limited ability to control product properties through process parameters and low yields for commercial processes. Absorber layers suffer from the appearance of different solid phases, as well as imperfections in crystalline particles and the quantity of voids, cracks, and other defects in the layers. In general, CIGS materials are complex, having many possible solid phases. Moreover, methods for large scale manufacturing of CIGS and related thin film solar cells can be difficult because of the chemical processes involved. In general, large scale processes for solar cells are unpredictable because of the difficulty in controlling numerous chemical and physical parameters involved in forming an absorber layer of suitable quality on a substrate, as well as forming the other components of an efficient solar cell assembly, both reproducibly and in high yield.

For example, introducing alkali ions at a controlled concentration into various layers and compositions of a CIGS-based solar cell has not been achieved in a general way. Conventional methods for introducing sodium do not readily provide homogenous concentration levels or control over sodium location in a CIGS film. The presence and level of alkali ions in various layers is a chemical parameter that should be controlled in a solar cell manufacturing process.

What is needed are compounds, compositions and processes to produce materials for photovoltaic layers, especially thin film layers for solar cell devices and other products.

BRIEF SUMMARY

Embodiments of this invention include the following.

This disclosure provides processes for making a thin film solar cell on a substrate by (a) providing a substrate coated with an electrical contact layer; (b) depositing a layer of an ink onto the contact layer of the substrate, wherein the ink contains photovoltaic absorber precursor compounds and an alkali ion source compound suspended or dissolved in a carrier; and (c) heating the substrate. The alkali ion source compound can be soluble in an organic solvent. The carrier may be an organic solvent. The photovoltaic absorber precursor compounds may be CIS or CIGS precursor compounds. In certain embodiments, steps (b) and (c) can be repeated.

The photovoltaic absorber precursor compounds can be polymeric precursor compounds made by reacting $M^B(ER)_3$ and $M^A(ER)$, wherein $M^B$ is In, Ga, or Al, $M^A$ is Cu or Ag, each E is S, Se, or Te, and each R is independently selected, for each occurrence, from alkyl, aryl, heteroaryl, alkenyl, amido, silyl, and inorganic and organic groups.

In some embodiments, the photovoltaic absorber precursor compounds can be selected from indium selenide, $In_2Se_3$, gallium selenide, $Ga_2Se_3$, copper selenide, CuSe, $Cu_2Se$, $InCl_3$, $GaCl_3$, CuCl, $Cu_2Cl$, $In(NO_3)_3$, $Ga(NO_3)_3$, indium oxide, $In_2O_3$, gallium oxide, $Ga_2O_3$, copper oxide, CuO, $Cu_2O$, or any mixtures or nanoparticle forms of the foregoing.

In certain embodiments, the ink may contain an alkali ion source compound $M^{alk}M^B(ER)_4$, wherein $M^{alk}$ is Li, Na, or K, $M^B$ is In, Ga, or Al, E is sulfur or selenium, and R is alkyl or aryl. The ink may contain $NaIn(Se^nBu)_4$, $NaIn(Se^sBu)_4$, $NaIn(Se^iBu)_4$, $NaIn(Se^nPr)_4$, $NaIn(Se^nhexyl)_4$, $NaGa(Se^nBu)_4$, $NaGa(Se^sBu)_4$, $NaGa(Se^iBu)_4$, $NaGa(Se^nPr)_4$, or $NaGa(Se^nhexyl)_4$.

The ink can contain an alkali ion source compound $M^{alk}(ER)$, wherein $M^{alk}$ is Li, Na, or K, E is sulfur or selenium, and R is alkyl or aryl. The ink may contain $Na(Se^nBu)$, $Na(Se^sBu)$, $Na(Se^iBu)$, $Na(Se^nPr)$, $Na(Se^nhexyl)$, $Na(Se^nBu)$, $Na(Se^sBu)$, $Na(Se^iBu)$, $Na(Se^nPr)$, or $Na(Se^nhexyl)$.

In some aspects, the ink may contain 0.001 to 20 atom percent sodium ions, or 0.01 to 2 atom percent sodium ions, or 0.5 atom percent sodium ions. In certain embodiments, the ink may be deficient in the quantity of a Group 11 atom.

Heating may be a process comprising converting the layer at a temperature of from 100° C. to 400° C.

In some embodiments, heating can be a process comprising annealing the layer at a temperature of from 400° C. to 650° C., or from 450° C. to 550° C.

In certain embodiments, after heating step (c), the layer may be annealed at a temperature of from 400° C. to 650° C., or from 450° C. to 550° C. to form a thin film material. The thickness of the layer after heating can be from 50 nm to 3 micrometers.

Depositing can be done by spraying, spray coating, spray deposition, spray pyrolysis, printing, screen printing, inkjet printing, aerosol jet printing, ink printing, jet printing, stamp printing, transfer printing, pad printing, flexographic printing, gravure printing, contact printing, reverse printing, thermal printing, lithography, electrophotographic printing, electrodepositing, electroplating, electroless plating, bath deposition, coating, wet coating, dip coating spin coating, knife coating, roller coating, rod coating, slot die coating, meyerbar coating, lip direct coating, capillary coating, liquid deposition, solution deposition, layer-by-layer deposition, spin casting, solution casting, or any combination of the foregoing.

The substrate may be a semiconductor, a doped semiconductor, silicon, gallium arsenide, insulators, glass, molybdenum glass, silicon dioxide, titanium dioxide, zinc oxide, silicon nitride, a metal, a metal foil, molybdenum, aluminum, beryllium, cadmium, cerium, chromium, cobalt, copper, gallium, gold, lead, manganese, molybdenum, nickel, palladium, platinum, rhenium, rhodium, silver, stainless steel, steel, iron, strontium, tin, titanium, tungsten, zinc, zirconium, a metal alloy, a metal silicide, a metal carbide, a polymer, a plastic, a conductive polymer, a copolymer, a polymer blend, a polyethylene terephthalate, a polycarbonate, a polyester, a polyester film, a mylar, a polyvinyl fluoride, polyvinylidene fluoride, a polyethylene, a polyetherimide, a polyethersulfone, a polyetherketone, a polyimide, a polyvinylchloride, an acrylonitrile butadiene styrene polymer, a silicone, an epoxy, paper, coated paper, or a combination of any of the foregoing.

Embodiments of this invention further provide inks for making a thin film CIS or CIGS solar cell comprising one or more CIS or CIGS precursor compounds and an alkali ion source compound dissolved or suspended in an organic solvent.

The alkali ion source compound and sodium concentration can be as described above.

BRIEF DESCRIPTION OF THE DRAWINGS

FIG. 4 shows results of methods for controlling the sodium concentration in an ink used to make a CIGS photovoltaic absorber. The sizes of CIGS grains were related to the concentration of sodium in the precursor ink.

FIG. 5 shows results of methods for controlling the sodium concentration in an ink used to make a CIGS photovoltaic absorber. The sizes of CIGS grains were related to the concentration of sodium in the precursor ink.

FIG. 6 shows a top view micrograph of a CIGS thin film of a solar cell.

FIG. 7 shows a cross sectional view micrograph of a finished solar cell embodiment.

FIG. 8 shows the I-V curve of a finished solar cell embodiment.

DETAILED DESCRIPTION

This invention provides methods and compositions for introducing alkali ions at a controlled concentration into various layers and compositions of a solar cell. Alkali ions can be provided in various layers and the amount of alkali ions can be precisely controlled in making a solar cell.

In some aspects, this disclosure provides a solution to a problem in making a photovoltaic absorber layer for an application such as a solar cell. The problem is the inability in general to precisely control the stoichiometric quantity of alkali metal atoms.

This disclosure provides a solution to the problem by the use of sodium in a soluble form that can be used in a liquid deposition from organic solvent. The sodium may be distributed using ink compositions in a controlled way in the CIGS material prior to the annealing step.

In one aspect, this disclosure provides processes to make a photovoltaic absorber layer by forming various layers of components on a substrate and converting the components to a material such as a thin film material. A component can be an element, a compound, a precursor, a polymeric precursor, or a material composition.

For example, polymeric precursors for photovoltaic materials are described in PCT/US2010/044055, PCT/US2010/044056, PCT/US2010/044054, PCT/US2010/044035, and PCT/US2010/044057, each of which is hereby incorporated by reference in its entirety for all purposes.

The layers of precursors on a substrate can be converted to a material composition by applying energy to the layered substrate article. Energy can be applied using heat, light, or radiation, or by applying chemical energy. In some embodiments, a layer may be converted to a material individually, before the deposition of a succeeding layer. In certain embodiments, a group of layers can be converted at the same time.

In general, the ability to select a predetermined stoichiometry in advance means that the stoichiometry is controllable.

Figure 1:
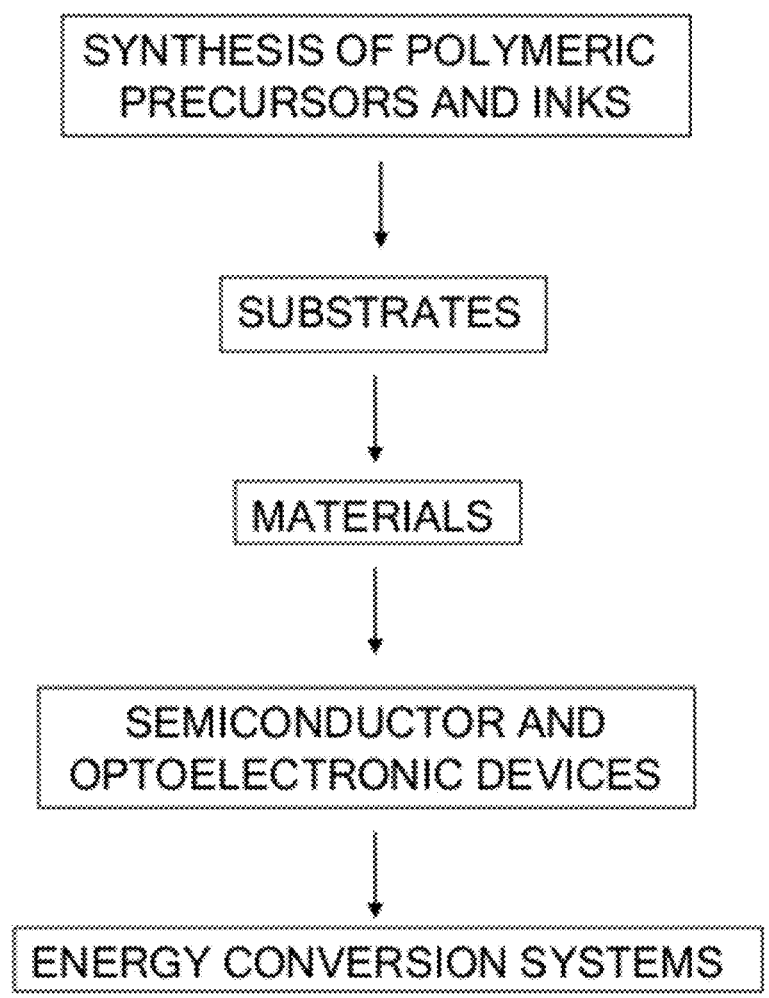
FIG. 1: Schematic representation of embodiments of this invention in which polymeric precursors and ink compositions are deposited onto particular substrates by methods including spraying, coating, and printing, and are used to make semiconductor and optoelectronic materials and devices, as well as energy conversion systems.

As shown in FIG. 1, embodiments of this invention may further provide optoelectronic devices and energy conversion systems. Following the synthesis of precursor compounds, the compounds can be sprayed, deposited, or printed onto substrates and formed into absorber materials and semiconductor layers. Absorber materials can be the basis for optoelectronic devices and energy conversion systems.

A process for making a photovoltaic absorber material having a predetermined level of alkali ions on a substrate may in general require providing a precursor ink having the predetermined level of alkali ions. The photovoltaic absorber material is prepared from the precursor inks by a deposition process. The photovoltaic absorber material can retain the precise, predetermined concentration of the alkali ions. The processes disclosed herein therefore allow a photovoltaic absorber material or layer having a specific target, predetermined concentration of alkali ions to be made using inks of this invention.

Figure 2:
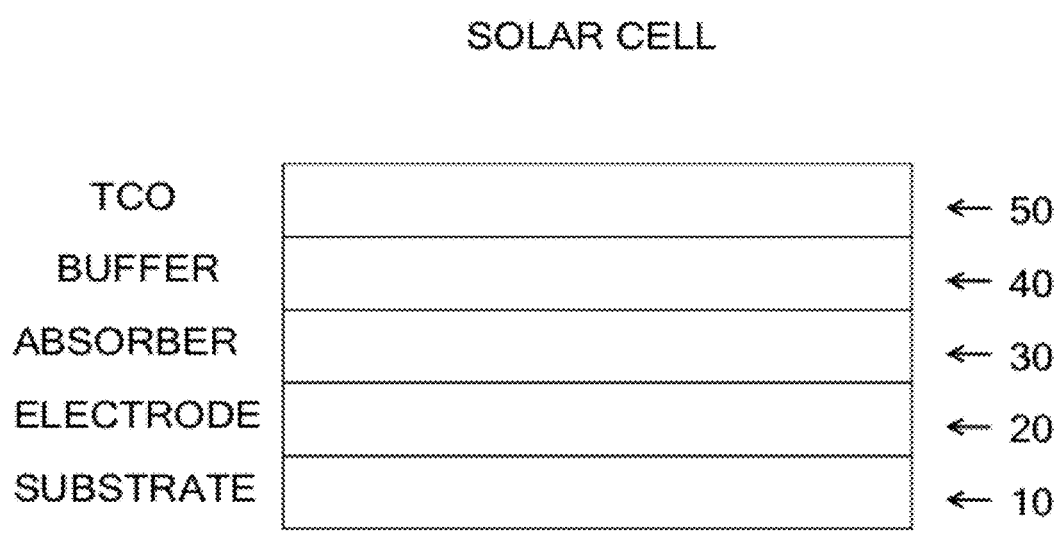
FIG. 2: Schematic representation of a solar cell embodiment of this invention.

As shown in FIG. 2, a solar cell device of this disclosure may have a substrate 10, an electrode layer 20, an absorber layer 30, a buffer layer 40, and a transparent conductive layer (TCO) 50.

As used herein, converting refers to a process, for example a heating or thermal process, which converts one or more precursor compounds into a semiconductor material.

As used herein, annealing refers to a process, for example a heating or thermal process, which transforms a semiconductor material from one form into another form.

Photovoltaic absorber precursor compounds include nanoparticle forms of precursor compounds for making photovoltaic absorbers.

Controlling Alkali Ions

Embodiments of this invention may provide methods and compositions for introducing alkali ions at a controlled concentration into various layers and compositions of a solar cell. Alkali ions can be provided in various layers and the amount of alkali ions can be precisely controlled in making a solar cell.

In some aspects, the ability to control the precise amount and location of alkali ions advantageously allows a solar cell to be made with substrates that do not contain alkali ions. For example, glass or ceramic substrates without sodium, or with low sodium, inorganic substrates, as well as polymer substrates without alkali ions can be used, among others.

This disclosure provides compounds which are soluble in organic solvents and can be used as sources for alkali ions. In some aspects, organic-soluble sources for alkali ions can be used as a component in ink formulations for depositing various layers. Using organic-soluble source compounds for alkali ions allows complete control over the concentration of alkali ions in inks for depositing layers, and for making photovoltaic absorber layers with a precisely controlled concentration of alkali ions.

In some aspects, an ink composition may advantageously be prepared to incorporate alkali metal ions. For example, an ink composition may be prepared using an amount of Na(ER), where E is S or Se and R is alkyl or aryl. R is preferably $^n$Bu, $^i$Bu, $^s$Bu, propyl or hexyl.

In certain embodiments, an ink composition may be prepared using an amount of NaIn(ER)$_4$, NaGa(ER)$_4$, LiIn (ER)$_4$, LiGa(ER)$_4$, KIn(ER)$_4$, KGa(ER)$_4$, or mixtures thereof, where E is S or Se and R is alkyl or aryl. R is preferably $^n$Bu, $^i$Bu, $^s$Bu, propyl or hexyl. These organic-soluble compounds can be used to control the level of alkali metal ions in an ink or deposited layer.

In certain embodiments, sodium can be provided in an ink at a concentration range of from about 0.01 to 5 atom percent by dissolving the equivalent amount of NaIn(Se$^n$Bu)$_4$, NaGa (Se$^n$Bu)$_4$ or NaSe$^n$Bu.

Methods and Compositions for Photovoltaic Absorber Layers

In some aspects, a layered substrate can be made by depositing a layer of a precursor onto the substrate. The layer of the precursor compound can be a single thin layer of the compound, or a plurality of layers of the compound. In certain embodiments, sodium ions may be introduced into any one or more of the layers.

Figure 3:
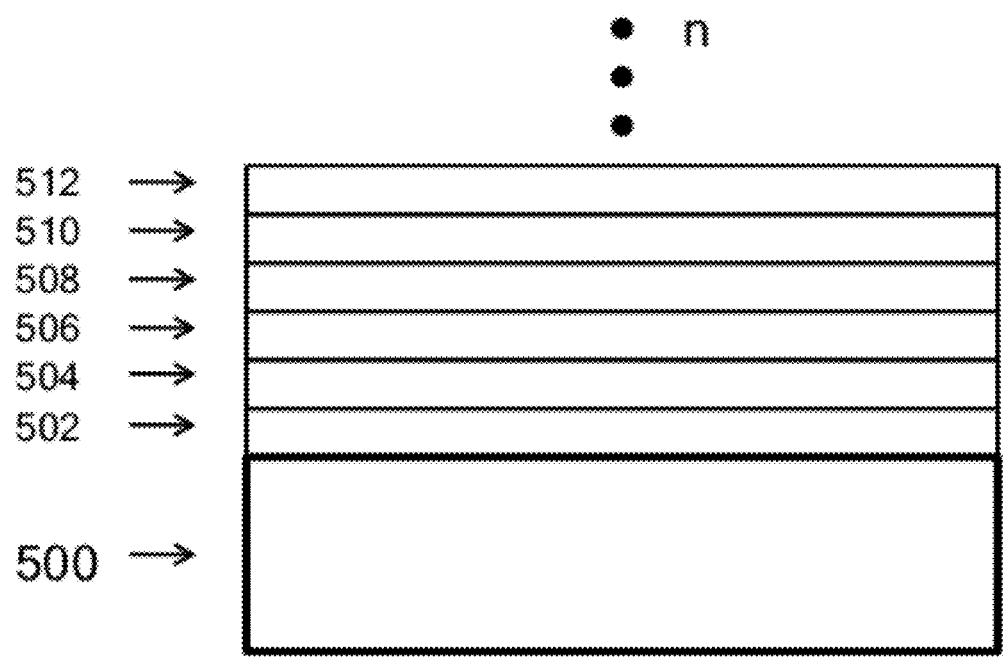
FIG. 3: Schematic representation of steps of a process to make a layered substrate in which a number of layers, n, are deposited on a substrate. Each deposited layer can contain atoms of any combination of Groups 11, 13, and chalcogen.

In some aspects, a layered substrate can have a number of layers, n, deposited on a substrate. As shown in FIG. 3, a process to make a layered substrate can have steps of depositing a number of layers 502, 504, 506, 508, 510, 512, and so on, up to n layers on a substrate 100. Each layer 502, 504, 506, 508, 510, 512, and so on, up to n layers can be composed of a single layer or a plurality of layers. Any of the layers can be heated to form a thin film material layer before the deposition of the next layer. The layers 502, 504, 506, 508, 510, 512, and so on, can each be composed of one or more precursor compounds. The precursor compounds can contain any combination of atoms of Groups 11 and 13 with arbitrarily predetermined stoichiometry, as well as chalcogen atoms. Any of the layers can be heated to form a thin film material layer before the deposition of the next layer. Any of the layers may be deficient or enriched in the quantity of a Group 11 atom. An optional chalcogen layer may be deposited on the second layer 410. Some of the layers 502, 504, 506, 508, 510, 512, and so on, can be a chalcogen layer. The chalcogen layer can be heated to form a thin film material layer. In some embodiments, the layers 502, 504, 506, 508, 510, 512, and so on, are alternating layers of one or more precursor compounds and a chalcogen layer. Some of the layers 502, 504, 506, 508, 510, 512, and so on, may include a layer of a precursor compound between chalcogen layers. Some of the layers 502, 504, 506, 508, 510, 512, and so on, may include a layer of a precursor compound that is deficient in a Group 11 atom between layers that are enriched in a Group 11 atom.

Each step of heating can transform any and all layers present on the substrate into a material layer. Thus, the schematic diagram in FIG. 3 represents the steps of a process to make a layered substrate which ultimately may be transformed into a single thin film material layer on the substrate. The schematic diagram in FIG. 3 does not necessarily directly represent a product material or a substrate article formed from the process.

As used herein, the expression $M^A$ is deficient, or $M^A$ is deficient to $M^B$ refers to a composition or formula in which there are fewer atoms of $M^A$ than $M^B$. $M^A$ is Cu or Ag, and $M^B$ is In, Ga, or Al. For example, a CIGS material that is deficient in Cu has fewer atoms of Cu than In plus Ga.

As used herein, the expression $M^A$ is enriched, or $M^A$ is enriched relative to $M^B$ refers to a composition or formula in which there are more atoms of $M^A$ than $M^B$. For example, a CIGS material that is enriched in Cu has more atoms of Cu than In plus Ga.

In various processes of this disclosure, a composition or material may optionally include a chalcogen layer, preferably selenium. The chalcogen can be introduced by a deposition or coating process, a contact transfer or printing process, an evaporation or sputtering process, a solution process, or a melt process, using elemental selenium or selenium source compounds.

Examples of chalcogen source compounds include organoselenides, RSeR, RSeSeR, RSeSeSeR, and R(Se)$_n$R where R is alkyl.

In various processes of this disclosure, a composition or material may optionally be subjected to a step of sulfurization or selenization.

Selenization may be carried out with elemental selenium or Se vapor. Sulfurization may be carried out with elemental sulfur. Sulfurization with H$_2$S or selenization with H$_2$Se may be carried out by using pure H$_2$S or H$_2$Se, respectively, or may be done by dilution in nitrogen.

A sulfurization or selenization step can be done at any temperature from about 200° C. to about 600° C., or from about 200° C. to about 650° C., or at temperatures below 200° C. One or more steps of sulfurization and selenization may be performed concurrently, or sequentially.

Embodiments of this invention may further provide the ability to make thin film materials having a compositional gradient. The compositional gradient may be a variation in the concentration or ratio of any of the atoms in a semiconductor or thin film material.

The process steps shown in FIG. 3 can be used to make a layered substrate having a gradient in the concentration of an alkali ion. A composition gradient can be formed using a series of precursor inks having a sequentially increasing or decreasing concentration of alkali ions.

In some embodiments, the compositional gradient may be a gradient of the level of alkali metal ions.

The precursors may be prepared as a series of ink formulations which represent the compositional gradient.

As used herein, the term transition metals refers to atoms of Groups 3 though 12 of the Periodic Table of the elements recommended by the Commission on the Nomenclature of Inorganic Chemistry and published in *IUPAC Nomenclature of Inorganic Chemistry, Recommendations* 2005.

Examples of solar cells can be found in, for example, Martin Green, *Solar Cells: Operating Principles, Technology and System Applications* (1986); Richard H. Bube, *Photovoltaic Materials* (1998); Antonio Luque and Steven Hegedus, *Handbook of Photovoltaic Science and Engineering* (2003).

A substrate for a solar cell may have an electrical contact layer. The electrical contact layer can be on the surface of the substrate. An electrical contact layer on a substrate can be the back contact for a solar cell or photovoltaic device.

Examples of an electrical contact layer include a layer of a metal or a metal foil, as well as a layer of molybdenum, aluminum, copper, gold, platinum, silver, stainless steel, a metal alloy, and a combination of any of the foregoing.

Examples of substrates on which a precursor of this disclosure can be deposited or printed include semiconductors, doped semiconductors, silicon, gallium arsenide, insulators, glass, molybdenum glass, silicon dioxide, titanium dioxide, zinc oxide, silicon nitride, and combinations thereof.

A substrate may be coated with molybdenum or a molybdenum-containing compound.

A substrate can be of any thickness, and can be from about 20 micrometers to about 20,000 micrometers or more in thickness.

Ink Compositions

Embodiments of this invention further provide ink compositions which contain one or more precursor compounds and an alkali ion source compound. The inks of this disclosure may be used to make photovoltaic materials by printing, coating or spraying onto a substrate.

An ink of this disclosure advantageously allows precise control of the concentration of alkali ions in the ink.

Inks of this disclosure can be made by any methods known in the art.

In some embodiments, an ink can be made by mixing a precursor compound with one or more carriers and an alkali ion source compound. The ink may be a suspension of the precursors in an organic carrier. In some variations, the ink is a solution of the precursors in an organic carrier. The carrier can include one or more organic liquids or solvents, and may contain an aqueous component. A carrier may be an organic solvent.

An ink can be made by providing one or more precursor compounds and solubilizing, dissolving, solvating, or dispersing the compounds with one or more carriers and an alkali ion source compound. The compounds dispersed in a carrier may be nanocrystalline, nanoparticles, microparticles, amorphous, or dissolved molecules.

The concentration of the precursors in an ink of this disclosure can be from about 0.001% to about 99% (w/w), or from about 0.001% to about 90%, or from about 0.1% to about 90%.

A precursor may exist in a liquid or flowable phase under the temperature and conditions used for deposition, coating or printing.

In some variations of this invention, precursors that are partially soluble, or are insoluble in a particular carrier can be dispersed in the carrier by high shear mixing.

As used herein, the term dispersing encompasses the terms solubilizing, dissolving, and solvating.

The carrier for an ink of this disclosure may be an organic liquid or solvent. Examples of a carrier for an ink of this disclosure include one or more organic solvents. A solvent may optionally contain an aqueous component.

An ink composition of this invention may contain any of the dopants disclosed herein, or a dopant known in the art.

Examples of a carrier for an ink of this disclosure include alcohol, methanol, ethanol, isopropyl alcohol, thiols, butanol, butanediol, glycerols, alkoxyalcohols, glycols, 1-methoxy-2-propanol, acetone, ethylene glycol, propylene glycol, propylene glycol laurate, ethylene glycol ethers, diethylene glycol, triethylene glycol monobutylether, propylene glycol monomethylether, 1,2-hexanediol, ethers, diethyl ether, aliphatic hydrocarbons, aromatic hydrocarbons, pentane, hexane, heptane, octane, isooctane, decane, cyclohexane, p-xylene, m-xylene, o-xylene, benzene, toluene, xylene, tetrahydrofuran, 2-methyltetrahydrofuran, siloxanes, cyclosiloxanes, silicone fluids, halogenated hydrocarbons, dibromomethane, dichloromethane, dichloroethane, trichloroethane chloroform, methylene chloride, acetonitrile, esters, acetates, ethyl acetate, butyl acetate, acrylates, isobornyl acrylate, 1,6-hexanediol diacrylate, polyethylene glycol diacrylate, ketones, acetone, methyl ethyl ketone, cyclohexanone, butyl carbitol, cyclopentanone, lactams, N-methylpyrrolidone, N-(2-hydroxyethyl)-pyrrolidone, cyclic acetals, cyclic ketals, aldehydes, amines, diamines, amides, dimethylformamide, methyl lactate, oils, natural oils, terpenes, and mixtures thereof.

An ink of this disclosure may further include components such as a surfactant, a dispersant, an emulsifier, an anti-foaming agent, a dryer, a filler, a resin binder, a thickener, a viscosity modifier, an anti-oxidant, a flow agent, a plasticizer, a conductivity agent, a crystallization promoter, an extender, a film conditioner, an adhesion promoter, and a dye. Each of these components may be used in an ink of this disclosure at a level of from about 0.001% to about 10% or more of the ink composition.

Examples of surfactants include siloxanes, polyalkyleneoxide siloxanes, polyalkyleneoxide polydimethylsiloxanes, polyester polydimethylsiloxanes, ethoxylated nonylphenols, nonylphenoxy polyethyleneoxyethanol, fluorocarbon esters, fluoroaliphatic polymeric esters, fluorinated esters, alkylphenoxy alkyleneoxides, cetyl trimethyl ammonium chloride, carboxymethylamylose, ethoxylated acetylene glycols, betaines, N-n-dodecyl-N,N-dimethylbetaine, dialkyl sulfosuccinate salts, alkylnaphthalenesulfonate salts, fatty acid salts, polyoxyethylene alkylethers, polyoxyethylene alkylallylethers, polyoxyethylene-polyoxypropylene block copolymers, alkylamine salts, quaternary ammonium salts, and mixtures thereof.

Examples of surfactants include anionic, cationic, amphoteric, and nonionic surfactants. Examples of surfactants include SURFYNOL, DYNOL, ZONYL, FLUORAD, and SILWET surfactants.

A surfactant may be used in an ink of this disclosure at a level of from about 0.001% to about 2% of the ink composition.

Examples of a dispersant include a polymer dispersant, a surfactant, hydrophilic-hydrophobic block copolymers, acrylic block copolymers, acrylate block copolymers, graft polymers, and mixtures thereof.

Examples of an emulsifier include a fatty acid derivative, an ethylene stearamide, an oxidized polyethylene wax, mineral oils, a polyoxyethylene alkyl phenol ether, a polyoxyethylene glycol ether block copolymer, a polyoxyethylene sorbitan fatty acid ester, a sorbitan, an alkyl siloxane polyether polymer, polyoxyethylene monostearates, polyoxyethylene monolaurates, polyoxyethylene monooleates, and mixtures thereof.

Examples of an anti-foaming agent include polysiloxanes, dimethylpolysiloxanes, dimethyl siloxanes, silicones, polyethers, octyl alcohol, organic esters, ethyleneoxide propyleneoxide copolymers, and mixtures thereof.

Examples of a dryer include aromatic sulfonic acids, aromatic carboxylic acids, phthalic acid, hydroxyisophthalic acid, N-phthaloylglycine, 2-Pyrrolidone 5-carboxylic acid, and mixtures thereof.

Examples of a filler include metallic fillers, silver powder, silver flake, metal coated glass spheres, graphite powder, carbon black, conductive metal oxides, ethylene vinyl acetate polymers, and mixtures thereof.

Examples of a resin binder include acrylic resins, alkyd resins, vinyl resins, polyvinyl pyrrolidone, phenolic resins, ketone resins, aldehyde resins, polyvinyl butyral resin, amide resins, amino resins, acrylonitrile resins, cellulose resins, nitrocellulose resins, rubbers, fatty acids, epoxy resins, ethylene acrylic copolymers, fluoropolymers, gels, glycols, hydrocarbons, maleic resins, urea resins, natural rubbers, natural gums, phenolic resins, cresols, polyamides, polybutadienes, polyesters, polyolefins, polyurethanes, isocynates, polyols, thermoplastics, silicates, silicones, polystyrenes, and mixtures thereof.

Examples of thickeners and viscosity modifiers include conducting polymers, celluloses, urethanes, polyurethanes, styrene maleic anhydride copolymers, polyacrylates, polycarboxylic acids, carboxymethylcelluoses, hydroxyethylcelluloses, methylcelluloses, methyl hydroxyethyl celluloses, methyl hydroxypropyl celluloses, silicas, gellants, aluminates, titanates, gums, clays, waxes, polysaccharides, starches, and mixtures thereof.

Examples of anti-oxidants include phenolics, phosphites, phosphonites, thioesters, stearic acids, ascorbic acids, catechins, cholines, and mixtures thereof.

Examples of flow agents include waxes, celluloses, butyrates, surfactants, polyacrylates, and silicones.

Examples of a plasticizer include alkyl benzyl phthalates, butyl benzyl phthalates, dioctyl phthalates, diethyl phthalates, dimethyl phthalates, di-2-ethylhexy-adipates, diisobutyl phthalates, diisobutyl adipates, dicyclohexyl phthalates, glycerol tribenzoates, sucrose benzoates, polypropylene glycol dibenzoates, neopentyl glycol dibenzoates, dimethyl isophthalates, dibutyl phthalates, dibutyl sebacates, tri-n-hexyltrimellitates, and mixtures thereof.

Examples of a conductivity agent include lithium salts, lithium trifluoromethanesulfonates, lithium nitrates, dimethylamine hydrochlorides, diethylamine hydrochlorides, hydroxylamine hydrochlorides, and mixtures thereof.

Examples of a crystallization promoter include copper chalcogenides, alkali metal chalcogenides, alkali metal salts, alkaline earth metal salts, sodium chalcogenates, cadmium salts, cadmium sulfates, cadmium sulfides, cadmium selenides, cadmium tellurides, indium sulfides, indium selenides, indium tellurides, gallium sulfides, gallium selenides, gallium tellurides, molybdenum, molybdenum sulfides, molybdenum selenides, molybdenum tellurides, molybdenum-containing compounds, and mixtures thereof.

An ink may contain one or more components selected from the group of a conducting polymer, silver metal, silver selenide, silver sulfide, copper metal, indium metal, gallium metal, zinc metal, alkali metals, alkali metal salts, alkaline earth metal salts, sodium chalcogenates, calcium chalcogenates, cadmium sulfide, cadmium selenide, cadmium telluride, indium sulfide, indium selenide, indium telluride, gallium sulfide, gallium selenide, gallium telluride, zinc sulfide, zinc selenide, zinc telluride, copper sulfide, copper selenide, copper telluride, molybdenum sulfide, molybdenum selenide, molybdenum telluride, and mixtures of any of the foregoing.

An ink of this disclosure may contain particles of a metal, a conductive metal, or an oxide. Examples of metal and oxide particles include silica, alumina, titania, copper, iron, steel, aluminum and mixtures thereof.

In certain variations, an ink may contain a biocide, a sequestering agent, a chelator, a humectant, a coalescent, or a viscosity modifier.

In certain aspects, an ink of this disclosure may be formed as a solution, a suspension, a slurry, or a semisolid gel or paste. An ink may include one or more precursors solubilized in a carrier, or may be a solution of the precursors. In certain variations, a precursor may include particles or nanoparticles that can be suspended in a carrier, and may be a suspension or paint of the precursors. In certain embodiments, a precursor can be mixed with a minimal amount of a carrier, and may be a slurry or semisolid gel or paste of the precursor.

The viscosity of an ink of this disclosure can be from about 0.5 centipoises (cP) to about 50 cP, or from about 0.6 to about 30 cP, or from about 1 to about 15 cP, or from about 2 to about 12 cP.

The viscosity of an ink of this disclosure can be from about 20 cP to about $2 \times 10^6$ cP, or greater. The viscosity of an ink of this disclosure can be from about 20 cP to about $1 \times 10^6$ cP, or from about 200 cP to about 200,000 cP, or from about 200 cP to about 100,000 cP, or from about 200 cP to about 40,000 cP, or from about 200 cP to about 20,000 cP.

The viscosity of an ink of this disclosure can be about 1 cP, or about 2 cP, or about 5 cP, or about 20 cP, or about 100 cP, or about 500 cP, or about 1,000 cP, or about 5,000 cP, or about 10,000 cP, or about 20,000 cP, or about 30,000 cP, or about 40,000 cP.

In some embodiments, an ink may contain one or more components from the group of a surfactant, a dispersant, an emulsifier, an anti-foaming agent, a dryer, a filler, a resin binder, a thickener, a viscosity modifier, an anti-oxidant, a flow agent, a plasticizer, a conductivity agent, a crystallization promoter, an extender, a film conditioner, an adhesion promoter, and a dye. In certain variations, an ink may contain one or more compounds from the group of cadmium sulfide, cadmium selenide, cadmium telluride, zinc sulfide, zinc selenide, zinc telluride, copper sulfide, copper selenide, and copper telluride. In some aspects, an ink may contain particles of a metal, a conductive metal, or an oxide.

An ink may be made by dispersing one or more precursor compounds of this disclosure in one or more carriers to form a dispersion or solution, along with an alkali ion source compound.

A precursor ink composition can be prepared by dispersing one or more precursors and an alkali ion source compound in a solvent, and heating the solvent to dissolve or disperse the precursors. The alkali ion source compound may have a concentration of from about 0.001 atom % to about 20 atom %, or from about 0.01 atom % to about 15 atom %, or from about 0.01 atom % to about 10 atom %, or from about 0.01 atom % to about 5 atom %, or from about 0.01 atom % to about 1 atom %, in the solution or dispersion.

An ink composition may further contain an additional indium-containing compound, or an additional gallium-containing compound. Examples of additional indium-containing compounds include $In(SeR)_3$, wherein R is alkyl or aryl. Examples of additional gallium-containing compounds include $Ga(SeR)_3$, wherein R is alkyl or aryl. For example, an ink may further contain $In(Se^nBu)_3$ or $Ga(Se^nBu)_3$, or mixtures thereof. In some embodiments, an ink may contain $Na(ER)$, where E is S or Se and R is alkyl or aryl. In certain embodiments, an ink may contain $NaIn(ER)_4$, $NaGa(ER)_4$, $LiIn(ER)_4$, $LiGa(ER)_4$, $KIn(ER)_4$, or $KGa(ER)_4$, where E is S or Se and R is alkyl or aryl. In certain embodiments, an ink may contain Cu(ER). For these additional compounds, R is preferably $^n$Bu, $^i$Bu, $^s$Bu, or Pr.

Processes for Films of Precursors on Substrates

The inks of this invention can be used to make photovoltaic materials by depositing an ink layer onto a substrate, where the layer contains one or more precursors and an alkali ion source compound.

As used herein, the terms "deposit," "depositing," and "deposition" refer to any method for placing a compound or composition onto a surface or substrate, including spraying, coating, and printing.

As used herein, the term "thin film" refers to a layer of atoms or molecules, or a composition layer on a substrate having a thickness of less than about 300 micrometers.

A deposited layer of this disclosure advantageously allows precise control of the concentration of alkali ions in the layer.

Examples of methods for depositing a precursor onto a surface or substrate include all forms of spraying, coating, and printing.

Solar cell layers can be made by depositing one or more precursors of this disclosure on a flexible substrate in a high throughput roll process. The depositing of precursors in a high throughput roll process can be done by spraying or coating a composition containing one or more precursors, or by printing an ink containing one or more precursors of this disclosure.

The depositing of compounds by spraying can be done at rates from about 10 nm to 3 micrometers per minute, or from 100 nm to 2 micrometers per minute.

Examples of methods for depositing an ink onto a surface or substrate include spraying, spray coating, spray deposition, spray pyrolysis, and combinations thereof.

Examples of methods for printing using an ink of this disclosure include printing, screen printing, inkjet printing, aerosol jet printing, ink printing, jet printing, stamp/pad printing, transfer printing, pad printing, flexographic printing, gravure printing, contact printing, reverse printing, thermal printing, lithography, electrophotographic printing, and combinations thereof.

Examples of methods for depositing an ink onto a surface or substrate include electrodepositing, electroplating, electroless plating, bath deposition, coating, dip coating, wet coating, spin coating, knife coating, roller coating, rod coating, slot die coating, meyerbar coating, lip direct coating, capillary coating, liquid deposition, solution deposition, layer-by-layer deposition, spin casting, and solution casting.

In some embodiments, a process for knife gap coating can be performed. The gap can be from 50 to 200 μm, or larger, and the knife speed can be from about 5 to 100 mm/s, or greater.

The substrate can be cleared using a stream from a nitrogen gas gun. Ink may be applied to the blade to fill the gap and make contact with the substrate. The ink is then coated in a single pass and the back surface is wiped or washed with toluene or organic solvent. The coated substrate can be transferred to a hot plate for conversion to a material. The conversion time can range from 40 seconds to 5 minutes or greater. The coating and conversion steps can be repeated to build up a desired film thickness. Thickness per pass can be from 75 to 150 nm, or from 10 to 3000 nm. The coated substrate is then annealed.

In certain embodiments, crack-free films with 500 nm or greater thickness per pass can be achieved.

In certain embodiments, a first ink may be deposited onto a substrate, and subsequently a second ink may be deposited onto the substrate. In certain embodiments, several different inks may be deposited onto the substrate to create a layer.

The depositing of precursors, including by spraying, coating, and printing, can be done in a controlled or inert atmosphere, such as in dry nitrogen and other inert gas atmospheres, as well as in a partial vacuum atmosphere.

The depositing of precursors can also be done by spin coating.

After conversion of the coated substrate, another precursor coating may be applied to the thin film material on the substrate by repeating the procedure above. This process can be repeated to prepare additional thin film material layers on the substrate.

After the last thin film material layer is prepared on the substrate, the substrate can be annealed.

Inks may be used to grow photovoltaic absorber layers, or other material, by using multiple inks with different compositions. In some embodiments, large grains can be achieved by using multiple inks.

The use of multiple inks allows a wide range of compositions to be manufactured in a controlled fashion. For example, many kinds of CIGS compositions can be made, and many compositions in CIGS phase space can be made.

A solar cell device can be made from a photovoltaic absorber layer on a substrate by carrying out various finishing steps.

In some embodiments, a finishing step includes a chemical bath treatment step. In a chemical bath treatment step, the photovoltaic absorber layer can be exposed to a buffer compound. Examples of a buffer compound include $In_2S_3$.

An additional finishing step is deposition of a buffer layer. A buffer layer of CdS can be made by chemical bath deposition.

Another finishing step is deposition of a TCO layer. The TCO layer can be made from Al:ZnO (AZO). The TCO layering step can include ZnO (intrinsic iZO).

A further finishing step is deposition of metal contacts on the TCO layer.

A solar cell can be finished by annealing in air, or in inert atmosphere. Some standards for testing and performance of photovoltaic (PV) devices are described by The National Renewable Energy Laboratory of the U.S. Department of Energy (DOE).

Embodiments of this invention may provide improved efficiency for solar cells used for light to electricity conversion.

As shown in FIG. 2, a solar cell device of this disclosure may have a substrate 10, an electrode layer 20, an absorber layer 30, a buffer layer 40, and a transparent conductive layer (TCO) 50. The substrate 10 may be metal, plastic, glass, or ceramic. The electrode layer 20 can be a molybdenum-containing layer. The absorber layer 30 may be a CIS, CIGS, AIS, AIGS, CAIS, CAIGS, CIGAS, AIGAS or CAIGAS layer. The buffer layer 40 may be a cadmium sulfide layer. The transparent conductive layer 50 can be an indium tin oxide layer or a doped zinc oxide layer.

A solar cell device of this disclosure may have a substrate, an electrode layer, an absorber layer, a buffer layer, an adhesion promoting layer, a junction partner layer, a transparent layer, a transparent electrode layer, a transparent conductive oxide layer, a transparent conductive polymer layer, a doped conductive polymer layer, an encapsulating layer, an anti-reflective layer, a protective layer, or a protective polymer layer. In certain variations, an absorber layer includes a plurality of absorber layers.

In some embodiments, a thin film photovoltaic device may have a transparent conductor layer, a buffer layer, a p-type absorber layer, an electrode layer, and a substrate. The transparent conductor layer may be a transparent conductive oxide (TCO) layer such as a zinc oxide layer, or zinc oxide layer doped with aluminum, or a carbon nanotube layer, or a tin oxide layer, or a tin oxide layer doped with fluorine, or an indium tin oxide layer, or an indium tin oxide layer doped with fluorine, while the buffer layer can be cadmium sulfide, or cadmium sulfide and high resistivity zinc oxide. The p-type absorber layer can be a CIGS layer, and the electrode layer can be molybdenum. The transparent conductor layer can be from about 0.1 to 2 micrometers in thickness, or more. In some embodiments, the transparent conductor layer can be 0.75 micrometers in thickness. The buffer layer can also be a cadmium sulfide n-type junction partner layer. In some embodiments, the buffer layer may be a silicon dioxide, an aluminum oxide, a titanium dioxide, or a boron oxide.

Some examples of transparent conductive oxides are given in K. Ellmer et al., Transparent Conductive Zinc Oxide, Vol. 104, Springer Series in Materials Science (2008).

The photovoltaic absorber layer made by the methods of this disclosure may have an empirical formula $Cu_x(In_{1-y}Ga_y)_v(S_{1-z}Se_z)_w$, where x is from 0.8 to 0.95, y is from 0 to 0.5, and z is from 0 to 1, v is from 0.95 to 1.05, and w is from 1.8 to 2.2. In some embodiments, w is from 2.0 to 2.2. The photovoltaic absorber layer made by the methods of this disclosure may have an empirical formula empirical formula $Cu_xIn_y(S_{1-z}Se_z)_w$, where x is from 0.8 to 0.95, y is from 0.95 to 1.05, z is from 0 to 1, and w is from 1.8 to 2.2. Methods for making a photovoltaic absorber layer can include a step of sulfurization or selenization.

Methods for making a photovoltaic absorber layer on a substrate include providing one or more precursor inks, providing a substrate, printing the inks onto the substrate, and heating the substrate at a temperature of from about 100° C. to about 600° C., or from about 100° C. to about 650° C. in an inert atmosphere, thereby producing a photovoltaic absorber layer having a thickness of from 0.01 to 100 micrometers. The printing can be done in screen printing, inkjet printing, transfer printing, flexographic printing, or gravure printing. The substrate may be glass, metal, polymer, plastic, or silicon. The method may further include adding to the ink an additional indium-containing compound, such as $In(SeR)_3$, wherein R is alkyl or aryl.

In general, an ink composition for depositing, spraying, or printing may contain an additional indium-containing compound, or an additional gallium-containing compound. Examples of additional indium-containing compounds include $In(SeR)_3$, wherein R is alkyl or aryl. Examples of additional gallium-containing compounds include $Ga(SeR)_3$, wherein R is alkyl or aryl. For example, an ink may further contain $In(Se^nBu)_3$ or $Ga(Se^nBu)_3$, or mixtures thereof. In some embodiments, an ink may contain Na(ER), where E is S or Se and R is alkyl or aryl. In certain embodiments, an ink may contain $NaIn(ER)_4$, $NaGa(ER)_4$, $LiIn(ER)_4$, $LiGa(ER)_4$, $KIn(ER)_4$, or $KGa(ER)_4$, where E is S or Se and R is alkyl or aryl.

As used herein, the term "solar cell" refers to individual solar cell as well as a solar cell array, which can combine a number of solar cells.

Chemical Definitions

As used herein, the term atom percent, atom %, or at % refers to the amount of an atom with respect to the final material in which the atoms are incorporated. For example, "0.5 at % Na in CIGS" refers to an amount of sodium atoms equivalent to 0.5 atom percent of the atoms in the CIGS material.

As used herein, the term (X,Y) when referring to compounds or atoms indicates that either X or Y, or a combination thereof may be found in the formula. For example, (S,Se) indicates that atoms of either sulfur or selenium, or any combination thereof may be found. Further, using this notation the amount of each atom can be specified. For example, when appearing in the chemical formula of a molecule, the notation (0.75 In,0.25 Ga) indicates that the atom specified by the symbols in the parentheses is indium in 75% of the compounds and gallium in the remaining 25% of the compounds, regardless of the identity any other atoms in the compound. In the absence of a specified amount, the term (X,Y) refers to approximately equal amounts of X and Y.

The atoms S, Se, and Te of Group 16 are referred to as chalcogens.

As used herein, the letter "S" in CIGS, AIGS, CAIGS, CIGAS, AIGAS and CAIGAS refers to sulfur or selenium or both. The letter "C" in CIGS, CAIGS, CIGAS, and CAIGAS refers to copper. The letter "A" in AIGS, CAIGS, AIGAS and CAIGAS which appears before the letters I and G refers to silver. The letter "I" in CIGS, AIGS, CAIGS, CIGAS, AIGAS and CAIGAS refers to indium. The letter "G" in CIGS, AIGS, CAIGS, CIGAS, AIGAS and CAIGAS refers to gallium. The letter "A" in CIGAS, AIGAS and CAIGAS which appears after the letters I and G refers to aluminum.

CAIGAS therefore could also be represented as Cu/Ag/In/Ga/Al/S/Se.

As used herein, the terms CIGS, AIGS, and CAIGS include the variations C(I,G)S, A(I,G)S, and CA(I,G)S, respectively, and CIS, AIS, and CAIS, respectively, as well as CGS, AGS, and CAGS, respectively, unless described otherwise.

The terms CIGAS, AIGAS and CAIGAS include the variations C(I,G,A)S, A(I,G,A)S, and CA(I,G,A)S, respectively, and CIGS, AIGS, and CAIGS, respectively, as well as CGAS, AGAS, and CAGAS, respectively, unless described otherwise.

The term CAIGAS refers to variations in which either C or Silver is zero, for example, AIGAS and CIGAS, respectively, as well as variations in which Aluminum is zero, for example, CAIGS, AIGS, and CIGS.

As used herein, the term CIGS includes the terms CIGSSe and CIGSe, and these terms refer to compounds or materials containing copper/indium/gallium/sulfur/selenium, which may contain sulfur or selenium or both. The term AIGS includes the terms AIGSSe and AIGSe, and these terms refer to compounds or materials containing silver/indium/gallium/sulfur/selenium, which may contain sulfur or selenium or both. The term CAIGS includes the terms CAIGSSe and CAIGSe, and these terms refer to compounds or materials containing copper/silver/indium/gallium/sulfur/selenium, which may contain sulfur or selenium or both.

As used herein, the term "chalcogenide" refers to a compound containing one or more chalcogen atoms bonded to one or more metal atoms.

The term "alkyl" as used herein refers to a hydrocarbyl radical of a saturated aliphatic group, which can be a branched or unbranched, substituted or unsubstituted aliphatic group containing from 1 to 22 carbon atoms. This definition applies to the alkyl portion of other groups such as, for example, cycloalkyl, alkoxy, alkanoyl, aralkyl, and other groups defined below. The term "cycloalkyl" as used herein refers to a saturated, substituted or unsubstituted cyclic alkyl ring containing from 3 to 12 carbon atoms. As used herein, the term "C(1-5)alkyl" includes C(1)alkyl, C(2)alkyl, C(3)alkyl, C(4)alkyl, and C(5)alkyl. Likewise, the term "C(3-22)alkyl" includes C(1)alkyl, C(2)alkyl, C(3)alkyl, C(4)alkyl, C(5)alkyl, C(6)alkyl, C(7)alkyl, C(8)alkyl, C(9)alkyl, C(10)alkyl, C(11)alkyl, C(12)alkyl, C(13)alkyl, C(14)alkyl, C(15)alkyl, C(16)alkyl, C(17)alkyl, C(18)alkyl, C(19)alkyl, C(20)alkyl, C(21)alkyl, and C(22)alkyl.

As used herein, an alkyl group may be designated by a term such as Me (methyl), Et (ethyl), Pr (any propyl group), $^n$Pr (n-Pr, n-propyl), $^i$Pr (i-Pr, isopropyl), Bu (any butyl group), $^n$Bu (n-Bu, n-butyl), $^i$Bu (i-Bu, isobutyl), $^s$Bu (s-Bu, sec-butyl), and $^t$Bu (t-Bu, tert-butyl).

The term "alkenyl" as used herein refers to an unsaturated, branched or unbranched, substituted or unsubstituted alkyl or cycloalkyl having 2 to 22 carbon atoms and at least one carbon-carbon double bond. The term "alkynyl" as used herein refers to an unsaturated, branched or unbranched, substituted or unsubstituted alkyl or cycloalkyl having 2 to 22 carbon atoms and at least one carbon-carbon triple bond.

The term "alkoxy" as used herein refers to an alkyl, cycloalkyl, alkenyl, or alkynyl group covalently bonded to an oxygen atom. The term "alkanoyl" as used herein refers to —C(=O)-alkyl, which may alternatively be referred to as "acyl." The term "alkanoyloxy" as used herein refers to —O—C(=O)-alkyl groups. The term "alkylamino" as used herein refers to the group —NRR', where R and R' are each either hydrogen or alkyl, and at least one of R and R' is alkyl. Alkylamino includes groups such as piperidino wherein R and R' form a ring. The term "alkylaminoalkyl" refers to -alkyl-NRR'.

The term "aryl" as used herein refers to any stable monocyclic, bicyclic, or polycyclic carbon ring system of from 4 to 12 atoms in each ring, wherein at least one ring is aromatic. Some examples of an aryl include phenyl, naphthyl, tetrahydro-naphthyl, indanyl, and biphenyl. Where an aryl substituent is bicyclic and one ring is non-aromatic, it is understood that attachment is to the aromatic ring. An aryl may be substituted or unsubstituted.

The term "heteroaryl" as used herein refers to any stable monocyclic, bicyclic, or polycyclic carbon ring system of from 4 to 12 atoms in each ring, wherein at least one ring is aromatic and contains from 1 to 4 heteroatoms selected from oxygen, nitrogen and sulfur. Phosphorous and selenium may be a heteroatom. Some examples of a heteroaryl include acridinyl, quinoxalinyl, pyrazolyl, indolyl, benzotriazolyl, furanyl, thienyl, benzothienyl, benzofuranyl, quinolinyl, isoquinolinyl, oxazolyl, isoxazolyl, pyrazinyl, pyridazinyl, pyridinyl, pyrimidinyl, pyrrolyl, and tetrahydroquinolinyl. A heteroaryl includes the N-oxide derivative of a nitrogen-containing heteroaryl.

The term "heterocycle" or "heterocyclyl" as used herein refers to an aromatic or nonaromatic ring system of from five to twenty-two atoms, wherein from 1 to 4 of the ring atoms are heteroatoms selected from oxygen, nitrogen, and sulfur. Phosphorous and selenium may be a heteroatom. Thus, a heterocycle may be a heteroaryl or a dihydro or tetrathydro version thereof.

The term "aroyl" as used herein refers to an aryl radical derived from an aromatic carboxylic acid, such as a substituted benzoic acid. The term "aralkyl" as used herein refers to an aryl group bonded to an alkyl group, for example, a benzyl group.

The term "carboxyl" as used herein represents a group of the formula —C(=O)OH or —C(=O)O$^-$. The terms "carbonyl" and "acyl" as used herein refer to a group in which an oxygen atom is double-bonded to a carbon atom >C=O. The term "hydroxyl" as used herein refers to —OH or —O$^-$. The term "nitrile" or "cyano" as used herein refers to —CN. The term "halogen" or "halo" refers to fluoro (—F), chloro (—Cl), bromo (—Br), and iodo (—I).

The term "substituted" as used herein refers to an atom having one or more substitutions or substituents which can be the same or different and may include a hydrogen substituent. Thus, the terms alkyl, cycloalkyl, alkenyl, alkynyl, alkoxy, alkanoyl, alkanoyloxy, alkylamino, alkylaminoalkyl, aryl, heteroaryl, heterocycle, aroyl, and aralkyl as used herein refer to groups which include substituted variations. Substituted variations include linear, branched, and cyclic variations, and groups having a substituent or substituents replacing one or more hydrogens attached to any carbon atom of the group. Substituents that may be attached to a carbon atom of the group include alkyl, cycloalkyl, alkenyl, alkynyl, alkoxy, alkanoyl, alkanoyloxy, alkylamino, alkylaminoalkyl, aryl, heteroaryl, heterocycle, aroyl, aralkyl, acyl, hydroxyl, cyano, halo, haloalkyl, amino, aminoacyl, alkylaminoacyl, acyloxy, aryloxy, aryloxyalkyl, mercapto, nitro, carbamyl, carbamoyl, and heterocycle. For example, the term ethyl includes without limitation —CH$_2$CH$_3$, —CHFCH$_3$, —CF$_2$CH$_3$, —CHFCH$_2$F, —CHFCHF$_2$, —CHFCF$_3$, —CF$_2$CH$_2$F, —CF$_2$CHF$_2$, —CF$_2$CF$_3$, and other variations as described above. In general, a substituent may itself be further substituted with any atom or group of atoms.

Some examples of a substituent for a substituted alkyl include halogen, hydroxyl, carbonyl, carboxyl, ester, aldehyde, carboxylate, formyl, ketone, thiocarbonyl, thioester, thioacetate, thioformate, selenocarbonyl, selenoester, selenoacetate, selenoformate, alkoxyl, phosphoryl, phosphonate, phosphinate, amino, amido, amidine, imino, cyano, nitro, azido, carbamato, sulfhydryl, alkylthio, sulfate, sulfonate, sulfamoyl, sulfonamido, sulfonyl, silyl, heterocyclyl, aryl, aralkyl, aromatic, and heteroaryl.

It will be understood that "substitution" or "substituted with" refers to such substitution that is in accordance with permitted valence of the substituted atom and the substituent. As used herein, the term "substituted" includes all permissible substituents.

In general, a compound may contain one or more chiral centers. Compounds containing one or more chiral centers may include those described as an "isomer," a "stereoisomer," a "diastereomer," an "enantiomer," an "optical isomer," or as a "racemic mixture." Conventions for stereochemical nomenclature, for example the stereoisomer naming rules of Cahn, Ingold and Prelog, as well as methods for the determination of stereochemistry and the separation of stereoisomers are known in the art. See, for example, Michael B. Smith and Jerry March, *March's Advanced Organic Chemistry*, 5th edition, 2001. The compounds and structures of this disclosure are meant to encompass all possible isomers, stereoisomers, diastereomers, enantiomers, and/or optical isomers that would be understood to exist for the specified compound or structure, including any mixture, racemic or otherwise, thereof.

This invention encompasses any and all tautomeric, solvated or unsolvated, hydrated or unhydrated forms, as well as any atom isotope forms of the compounds and compositions disclosed herein.

This invention encompasses any and all crystalline polymorphs or different crystalline forms of the compounds and compositions disclosed herein.

Additional Embodiments

All publications, references, patents, patent publications and patent applications cited herein are each hereby specifically incorporated by reference in their entirety for all purposes.

While this invention has been described in relation to certain embodiments, aspects, or variations, and many details have been set forth for purposes of illustration, it will be apparent to those skilled in the art that this invention includes additional embodiments, aspects, or variations, and that some of the details described herein may be varied considerably without departing from this invention. This invention includes such additional embodiments, aspects, and variations, and any modifications and equivalents thereof. In particular, this invention includes any combination of the features, terms, or elements of the various illustrative components and examples.

The use herein of the terms "a," "an," "the" and similar terms in describing the invention, and in the claims, are to be construed to include both the singular and the plural.

The terms "comprising," "having," "include," "including" and "containing" are to be construed as open-ended terms which mean, for example, "including, but not limited to." Thus, terms such as "comprising," "having," "include," "including" and "containing" are to be construed as being inclusive, not exclusive.

Recitation of a range of values herein refers individually to each and any separate value falling within the range as if it were individually recited herein, whether or not some of the values within the range are expressly recited. For example, the range "4 to 12" includes without limitation any whole, integer, fractional, or rational value greater than or equal to 4 and less than or equal to 12, as would be understood by those skilled in the art. Specific values employed herein will be understood as exemplary and not to limit the scope of the invention.

Recitation of a range of a number of atoms herein refers individually to each and any separate value falling within the range as if it were individually recited herein, whether or not some of the values within the range are expressly recited. For example, the term "C1-8" includes without limitation the species C1, C2, C3, C4, C5, C6, C7, and C8.

Definitions of technical terms provided herein should be construed to include without recitation those meanings associated with these terms known to those skilled in the art, and are not intended to limit the scope of the invention. Definitions of technical terms provided herein shall be construed to dominate over alternative definitions in the art or definitions which become incorporated herein by reference to the extent that the alternative definitions conflict with the definition provided herein.

The examples given herein, and the exemplary language used herein are solely for the purpose of illustration, and are not intended to limit the scope of the invention. All examples and lists of examples are understood to be non-limiting.

When a list of examples is given, such as a list of compounds, molecules or compositions suitable for this invention, it will be apparent to those skilled in the art that mixtures of the listed compounds, molecules or compositions may also be suitable.

EXAMPLES

Example 1

Sodium-Containing Inks for Photovoltaic Absorbers

Figure 4:
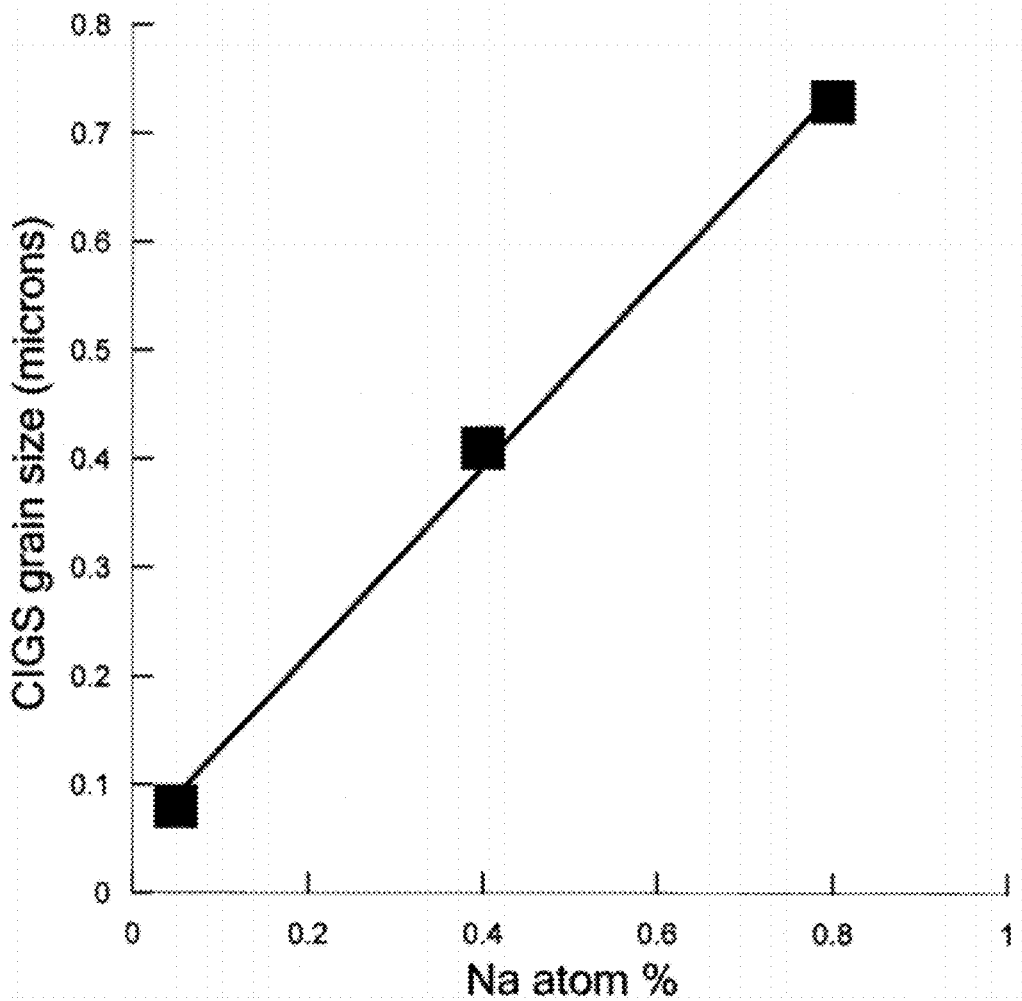
FIG. 4.

FIG. 4: FIG. 4 shows results of methods for controlling the sodium concentration in an ink used to make a CIGS photovoltaic absorber. By controlling the concentration of sodium in the precursor ink, the sizes of CIGS grains produced could be controlled. FIG. 4 shows that the sizes of CIGS grains were related to the concentration of sodium in the precursor ink used to make the CIGS material. For these examples, the annealing was done at 525° C. for 5 min in the presence of Se vapor in an enclosure.

Figure 5:
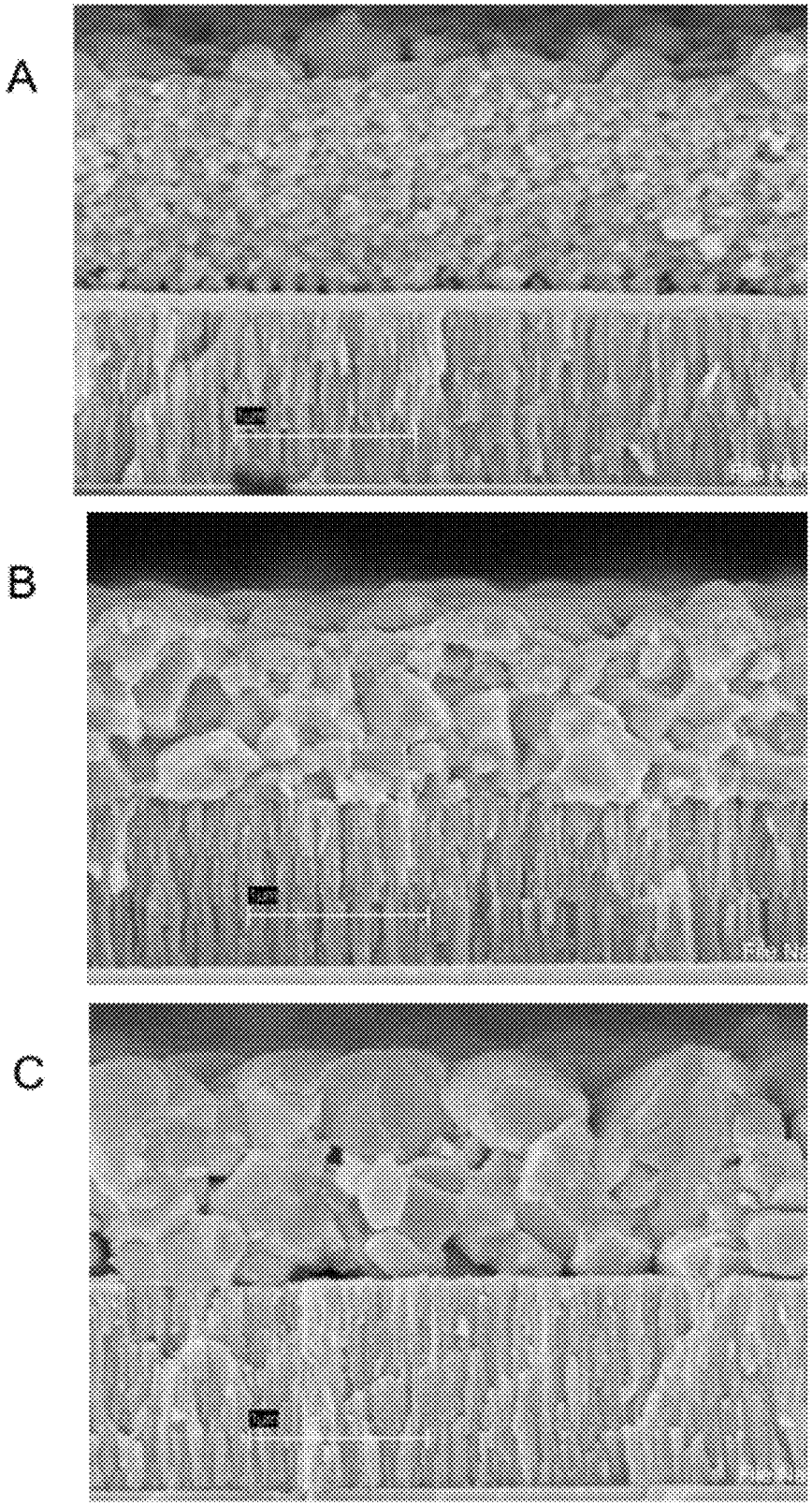
FIG. 5.

FIG. 5 shows cross-sectional micrographs corresponding to the data of FIG. 4.

Example 2

A solar cell was made by the following process.

A first ink was prepared by dissolving the Cu-enriched CIGS polymeric precursor compound $\{Cu_{1.1}In_{0.7}Ga_{0.3}(Se'Bu)_{1.1}(Se''Bu)_{3.0}\}$ with 0.5 at % Na supplied via $NaIn(Se''Bu)_4$ in heptane, 50% polymeric precursor content, by weight, followed by dilution with cyclohexane to about 25% polymeric precursor content, by weight, in an inert atmosphere glove box. The resulting ink was filtered through a 0.2 μm PTFE syringe filter prior to use.

A second ink was made prepared by dissolving the Cu-deficient CIGS polymeric precursor compound $\{Cu_{0.85}In_{0.7}Ga_{0.3}(Se'Bu)_{0.85}(Se''Bu)_{3.0}\}$ with 0.5 at % Na supplied via $NaIn(Se''Bu)_4$ in heptane, 25% polymeric precursor content, by weight, in an inert atmosphere glove box. The resulting ink was filtered through a 0.2 μm. PTFE syringe filter prior to use.

An 0.04 mL aliquot of the first ink was deposited onto a piece of 2 inch by 2 inch square Mo-coated sodalime glass substrate using a knife coater (RK Instruments) in an inert nitrogen atmosphere glove box with a knife speed of 10 mm/s. The wet substrate was transferred to a pre-heated 300° C. hot plate for 5 minutes to dry and convert the polymeric precursor to a Cu-enriched CIGS material. The resulting Cu-enriched CIGS film was annealed at 550° C. for 15 minutes in a pre-heated furnace.

An 0.04 mL aliquot of the second ink was deposited onto the Cu-enriched CIGS film on the substrate using the knife coater under the same conditions. The wet substrate was transferred to a pre-heated 300° C. hot plate for 5 minutes to dry and convert the polymeric precursor to a Cu-deficient CIGS material. Following this, 20 layers of the second ink were deposited and converted in a like manner. The substrate was then heated in a pre-heated furnace at 550° C. for 5 minutes while the Cu-deficient CIGS thin film on the substrate was exposed to Se vapor. The Cu-deficient CIGS thin film was exposed to Se vapor by placing the surface of the substrate in an enclosure, and generating Se vapor in the enclosure within the furnace. The resulting Cu-deficient CIGS thin film on the substrate had a thickness of about 1.5 μm.

The solar cell was finished by first treating the substrate with a chemical bath deposition (CBD) of $In_2Se_3$. 100 mL of an aqueous stock solution of 0.025 M $InCl_3$ and 100 mL of an aqueous stock solution of 0.5 M thioacetamide were diluted in 300 mL DI water and quickly transferred to a pre-heated 65° C. 500 mL CBD vessel. The substrate was quickly transferred to the CBD vessel and soaked for 15 min at 65° C. Substrates were then washed with water 3 times.

A buffer layer of CdS was made shortly thereafter by chemical bath deposition. The substrates were placed in a 500 mL CBD vessel and pre-heated to 65° C. 366 mL DI water and 62.5 mL ammonium hydroxide were added to the vessel. 50 mL of a stock solution of 0.015 M $CdSO_4$ and 25 mL of a stock solution of 1.5 M thiourea were added with stirring. The substrate was soaked for 16 min at 65° C. Substrates were then rinsed with DI water and 2-propanol, and blown dry with nitrogen.

A TCO layer of Al:ZnO (AZO) was next deposited by sputtering in vacuum. A ZnO (iZO) layer was also used. Metal contacts were deposited on the TCO layer by sputtering.

Figure 6:
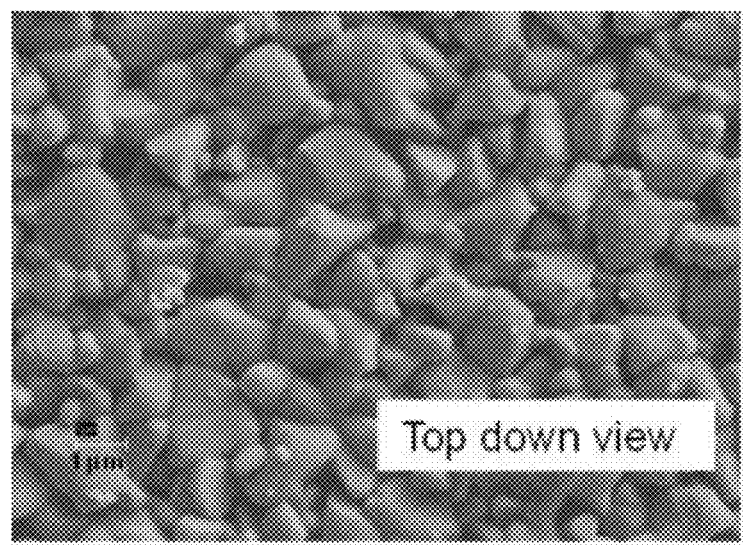
FIG. 6.

FIG. 6 shows a top view micrograph of the CIGS thin film of the solar cell. FIG. 6 illustrates superior grain size, morphology and overall density and dispersion.

Figure 7:
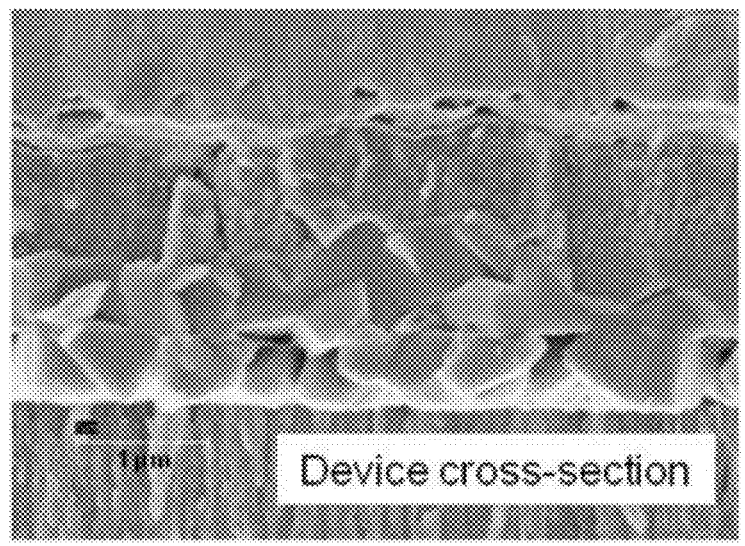
FIG. 7.

FIG. 7 shows a cross sectional view micrograph of the finished solar cell embodiment.

Figure 8:
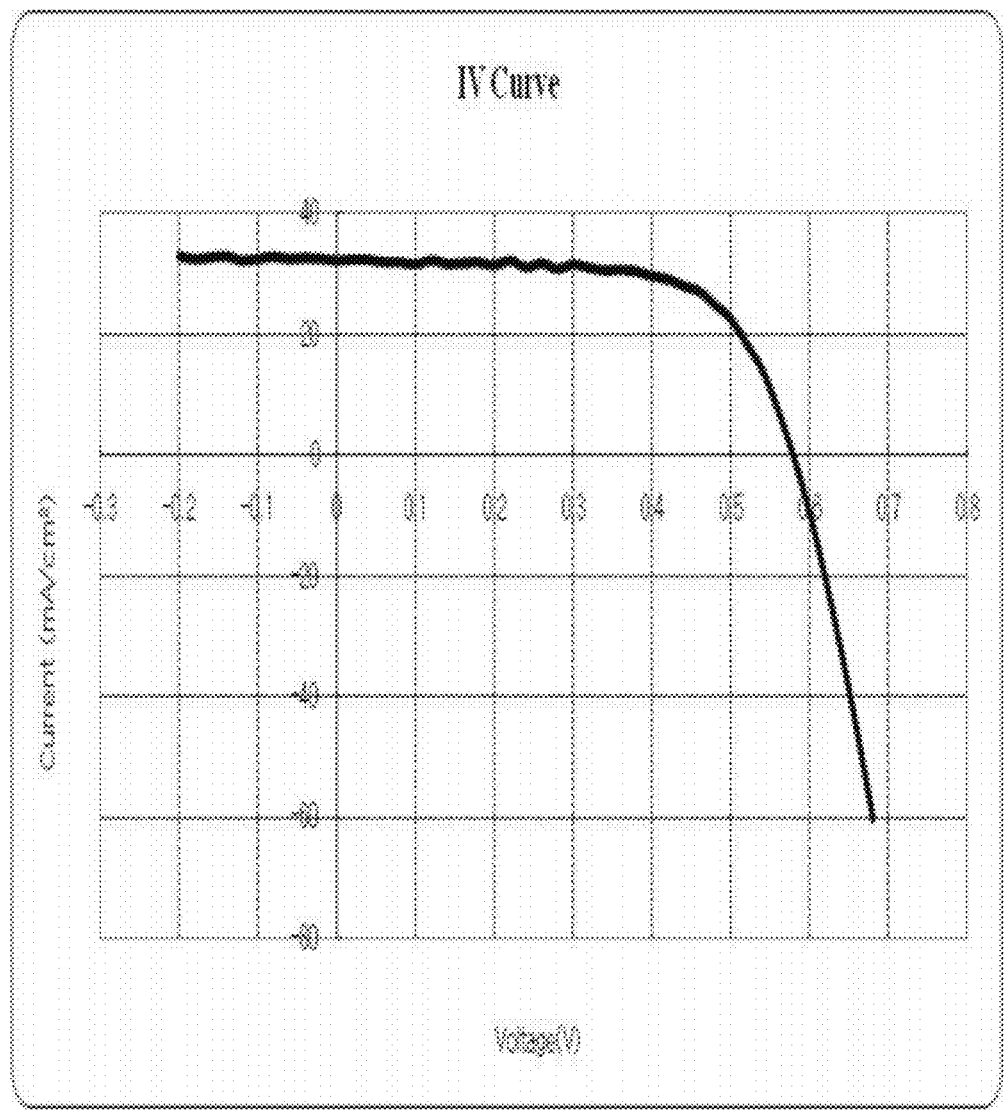
FIG. 8.

The solar cell current-voltage curve is shown in FIG. 8. The efficiency of the solar cell was 12.5%, and the I-V performance parameters are shown in Table 1.

Measurements were made under simulated AM1.5G sunlight at 1000 W/m$^2$ and 25° C.

TABLE 1

Performance of CIGS thin film solar cell

| Parameter | Value |
|---|---|
| $V_{OC}$ | 0.579 V |
| $I_{SC}$ | 10.96 mA |
| $J_{SC}$ | 32.2 mA/cm$^2$ |
| Fill Factor | 66.9% |
| $I_{max}$ | 9.22 mA |
| $V_{max}$ | 0.46 V |
| $P_{max}$ | 4.24 mW |
| Efficiency | 12.5% |

Example 3

A solar cell was made by the following process.

A first ink was prepared by dissolving the Cu-enriched CIGS polymeric precursor compound $\{Cu_{1.1}In_{0.7}Ga_{0.3}(Se''Bu)_{1.1}(Se''Bu]_{3.0}\}$ with 0.5 at % Na supplied via NaIn(Se''Bu)$_4$ in heptane, 50% polymer content, by weight, followed by dilution with cyclohexane to about 25% polymer content, by weight, in an inert atmosphere glove box. The resulting ink was filtered through a 0.2 μm PTFE syringe filter prior to use.

A second ink was made prepared by dissolving the Cu-deficient CIGS polymeric precursor compound $\{Cu_{0.85}In_{0.7}Ga_{0.3}(Se^tBu)_{0.85}(Se''Bu)_{3.0}\}$ with 0.5 at % Na supplied via NaIn(Se''Bu)$_4$ in heptane, 25% polymer content, by weight, in an inert atmosphere glove box. The resulting ink was filtered through a 0.2 μm PTFE syringe filter prior to use.

An 0.04 mL aliquot of the first ink was deposited onto a piece of 2 inch by 2 inch square Mo-coated sodalime glass substrate using a knife coater (Global Instrument) in an inert nitrogen atmosphere glove box with a knife speed of 5 mm/s. The wet substrate was transferred to a pre-heated 300° C. hot plate for 5 minutes to dry and convert the polymer to a Cu-enriched CIGS thin film. The substrate was heated at 550° C. for 15 minutes in a pre-heated furnace.

An 0.04 mL aliquot of the second ink was deposited onto the Cu-enriched CIGS thin film with a knife speed of 20 mm/s. The wet polymer film was transferred to a pre-heated 300° C. hot plate for 5 minutes to dry and convert the polymer to a Cu-deficient CIGS thin film material. Following this, 13 additional layers of the second ink were deposited and converted in like manner. The substrate was then heated in a pre-heated furnace at 550° C. for 5 minutes while the Cu-deficient CIGS thin film on the substrate was exposed to Se vapor. The Cu-deficient CIGS thin film was exposed to Se vapor by enclosing the surface of the substrate in an enclosure, and generating Se vapor in the enclosure within the furnace. The resulting Cu-deficient CIGS thin film on the substrate had a thickness of about 1.5 μm.

The solar cell was finished as in the previous example.

Example 4

A solar cell was made by the following process.

A first ink was prepared by dissolving $\{Cu_{1.1}In_{0.7}Ga_{0.3}(Se^tBu)_{1.1}(Se''Bu]_{3.0}\}$ with 0.5 at % Na supplied via NaIn(Se''Bu)$_4$ in heptane, 25% polymer content, by weight, in an inert atmosphere glove box. The resulting ink was filtered through a 0.2 μm PTFE syringe filter prior to use.

A second ink was made prepared by dissolving $\{Cu_{0.85}In_{0.7}Ga_{0.3}(Se^tBu)_{0.85}(Se''Bu)_{3.0}\}$ with 0.5 at % Na supplied via NaIn(Se''Bu)$_4$ in heptane, 25% polymer content, by weight, in an inert atmosphere glove box. The resulting ink was filtered through a 0.2 μm PTFE syringe filter prior to use.

An 0.04 mL aliquot of the first ink was deposited onto a piece of 2 inch by 2 inch square Mo-coated sodalime glass substrate using a knife coater (RK Instruments) in an inert nitrogen atmosphere glove box with a knife speed of 20 mm/s. The wet polymer film on the substrate was transferred to a pre-heated 300° C. hot plate for 5 minutes to dry and convert the polymer to a Cu-enriched CIGS material. The resulting Cu-enriched CIGS film was annealed at 550° C. for 15 minutes in a pre-heated furnace.

An 0.04 mL aliquot of the second ink was deposited onto the above piece of 2 inch by 2 inch square Cu-enriched coated Mo/glass substrate using a knife coater under the same conditions. The wet polymer film on the substrate was transferred to a pre-heated 300° C. hot plate for 3 minutes to dry and convert the polymer to a Cu-deficient CIGS material. This deposition process (coat/convert) was repeated to give a total of 13 layers of the second ink and a CIGS material with overall Cu-deficient stoichiometry. The final deposition/conversion was followed by annealing in a pre-heated furnace at 550° C. for 5 minutes in the presence of Se vapor. The thin film was exposed to Se vapor by enclosing the surface of the substrate in an enclosure, and generating Se vapor in the enclosure within the furnace. The resulting Cu-deficient CIGS thin film on the substrate had a thickness of about 1.5 μm.

The solar cell was finished as in the previous example.

What is claimed is:

1. A process for making a thin film solar cell on a substrate comprising:
   (a) providing a substrate coated with an electrical contact layer;
   (b) depositing an ink onto the contact layer of the substrate, wherein the ink contains an alkali ion source compound dissolved in the ink and one or more photovoltaic absorber precursor compounds suspended or dissolved in the ink; and
   (c) heating the substrate.

2. The process of claim 1, wherein the ink contains an alkali ion source compound $M^{alk}M^B(ER)_4$, wherein $M^{alk}$ is Li, Na, or K, $M^B$ is In, Ga, or Al, E is sulfur or selenium, and R is alkyl or aryl.

3. The process of claim 1, wherein the ink contains NaIn(Se''Bu)$_4$, NaIn(Se$^s$Bu)$_4$, NaIn(Se$^i$Bu)$_4$, NaIn(Se''Pr)$_4$, NaIn(Se''hexyl)$_4$, NaGa(Se''Bu)$_4$, NaGa(Se$^s$Bu)$_4$, NaGa(Se$^i$Bu)$_4$, NaGa(Se''Pr)$_4$, or NaGa(Se''hexyl)$_4$.

4. The process of claim 1, wherein the ink contains an alkali ion source compound $M^{alk}(ER)$, wherein $M^{alk}$ is Li, Na, or K, E is sulfur or selenium, and R is alkyl or aryl.

5. The process of claim 1, wherein the ink contains Na(Se''Bu), Na(Se$^s$Bu), Na(Se$^i$Bu), Na(Se''Pr), Na(Se''hexyl), Na(Se''Bu), Na(Se$^s$Bu), Na(Se$^i$Bu), Na(Se''Pr), or Na(Se''hexyl).

6. The process of claim 1, wherein the ink contains 0.001 to 20 atom percent sodium ions.

7. The process of claim 1, wherein the ink contains 0.01 to 2 atom percent sodium ions.

8. The process of claim 1, wherein the alkali ion source compound is soluble in an organic solvent.

9. The process of claim 1, wherein the carrier is an organic solvent.

10. The process of claim 1, wherein the photovoltaic absorber precursor compounds are CIS or CIGS precursor compounds.

11. The process of claim 1, wherein the photovoltaic absorber precursor compounds are selected from indium selenide, $In_2Se_3$, gallium selenide, $Ga_2Se_3$, copper selenide, CuSe, $Cu_2Se$, $InCl_3$, $GaCl_3$, CuCl, $Cu_2Cl$, $In(NO_3)_3$, $Ga(NO_3)_3$, indium oxide, $In_2O_3$, gallium oxide, $Ga_2O_3$, copper oxide, CuO, $Cu_2O$, or any mixtures or nanoparticle forms of the foregoing.

12. The process of claim 1, wherein the photovoltaic absorber precursor compounds are polymeric precursor compounds made by reacting $M^B(ER)_3$ and $M^A(ER)$, wherein $M^B$ is In, Ga, or Al, $M^A$ is Cu or Ag, each E is S, Se, or Te, and each R is independently selected, for each occurrence, from alkyl, aryl, heteroaryl, alkenyl, amido, silyl, and inorganic and organic groups.

13. The process of claim 1, wherein steps (b) and (c) are repeated.

14. The process of claim 1, wherein the ink is deficient in the quantity of a Group 11 atom.

15. The process of claim 1, wherein heating is a process comprising converting the ink at a temperature of from 100° C. to 400° C.

16. The process of claim 1, wherein heating is a process comprising annealing the substrate at a temperature of from 400° C. to 650° C., or from 450° C. to 550° C.

17. The process of claim 1, wherein after heating step (c), the substrate is annealed at a temperature of from 400° C. to 650° C. to form a thin film material.

18. The process of claim 1, wherein the depositing is done by spraying, spray coating, spray deposition, spray pyrolysis, printing, screen printing, inkjet printing, aerosol jet printing, ink printing, jet printing, stamp printing, transfer printing, pad printing, flexographic printing, gravure printing, contact printing, reverse printing, thermal printing, lithography, electrophotographic printing, electrodepositing, electroplating, electroless plating, bath deposition, coating, wet coating, dip coating spin coating, knife coating, roller coating, rod coating, slot die coating, meyerbar coating, lip direct coating, capillary coating, liquid deposition, solution deposition, layer-by-layer deposition, spin casting, solution casting, or any combination of the foregoing.

19. The process of claim 1, wherein the substrate coated with an electrical contact layer is a conducting substrate.

20. The process of claim 1, wherein the substrate is a semiconductor, a doped semiconductor, silicon, gallium arsenide, insulators, glass, molybdenum glass, silicon dioxide, titanium dioxide, zinc oxide, silicon nitride, a metal, a metal foil, molybdenum, aluminum, beryllium, cadmium, cerium, chromium, cobalt, copper, gallium, gold, lead, manganese, molybdenum, nickel, palladium, platinum, rhenium, rhodium, silver, stainless steel, steel, iron, strontium, tin, titanium, tungsten, zinc, zirconium, a metal alloy, a metal silicide, a metal carbide, a polymer, a plastic, a conductive polymer, a copolymer, a polymer blend, a polyethylene terephthalate, a polycarbonate, a polyester, a polyester film, a mylar, a polyvinyl fluoride, polyvinylidene fluoride, a polyethylene, a polyetherimide, a polyethersulfone, a polyetherketone, a polyimide, a polyvinylchloride, an acrylonitrile butadiene styrene polymer, a silicone, an epoxy, paper, coated paper, or a combination of any of the foregoing.

21. A solar cell made by the process of claim 1.

* * * * *